US012592518B2

(12) United States Patent
Doll

(10) Patent No.: US 12,592,518 B2
(45) Date of Patent: Mar. 31, 2026

(54) HANDS-FREE CONNECTORS

(71) Applicant: Microsoft Technology Licensing, LLC, Redmond, WA (US)

(72) Inventor: Wade J. Doll, Enumclaw, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 598 days.

(21) Appl. No.: 18/086,073

(22) Filed: Dec. 21, 2022

(65) Prior Publication Data

US 2024/0213719 A1 Jun. 27, 2024

(51) Int. Cl.
| | |
|---|---|
| *H01R 13/642* | (2006.01) |
| *H01R 12/71* | (2011.01) |
| *H01R 13/502* | (2006.01) |
| *H01R 13/629* | (2006.01) |
| *H05K 7/20* | (2006.01) |

(52) U.S. Cl.
CPC ......... *H01R 13/642* (2013.01); *H01R 12/716* (2013.01); *H01R 13/502* (2013.01); *H01R 13/62905* (2013.01); *H05K 7/20218* (2013.01); *H01R 2201/06* (2013.01)

(58) Field of Classification Search
CPC .. H01R 13/642; H01R 12/716; H01R 13/502; H01R 13/62905; H01R 2201/06; H05K 7/20218; H05K 7/1492
See application file for complete search history.

(56) References Cited

U.S. PATENT DOCUMENTS

| | | | | |
|---|---|---|---|---|
| 5,322,447 | A * | 6/1994 | Okada | H01R 25/006 439/541.5 |
| 2010/0097752 | A1* | 4/2010 | Doll | H05K 7/20736 361/679.48 |
| 2011/0151685 | A1* | 6/2011 | Hamner | H05K 7/1439 439/65 |
| 2014/0273551 | A1* | 9/2014 | Resendez | H01R 12/737 439/65 |
| 2020/0214164 | A1* | 7/2020 | Doll | H05K 7/1489 |
| 2024/0213719 | A1* | 6/2024 | Doll | H01R 13/502 |

OTHER PUBLICATIONS

International Search Report and Written Opinion received for PCT Application No. PCT/US23/035939, Mar. 5, 2024, 16 pages.
International Preliminary Report on Patentability (Chapter I) received for PCT Application No. PCT/US23/035939, mailed on Jul. 3, 2025, 11 pages.

* cited by examiner

*Primary Examiner* — Abdullah A Riyami
*Assistant Examiner* — Nader J Alhawamdeh
(74) *Attorney, Agent, or Firm* — Rainier Patents, P.S.

(57) ABSTRACT

The description relates to connectors for connecting components of a system. One example can include a rectangular housing that has connectors positioned along at least one side. A single axis deployment mechanism can be configured to constrain movement of the connectors to a single axis. Upon receiving input from an angle that is perpendicular or oblique to the axis, the single axis deployment mechanism can be configured to cause the connectors to move sequentially from either of a stored position or a deployed position to the other of the stored position or the deployed position.

20 Claims, 17 Drawing Sheets

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100A

HANDS FREE CONNECTOR SYSTEM 100B

HANDS FREE CONNECTOR SYSTEM 100B

METHOD <u>800</u>

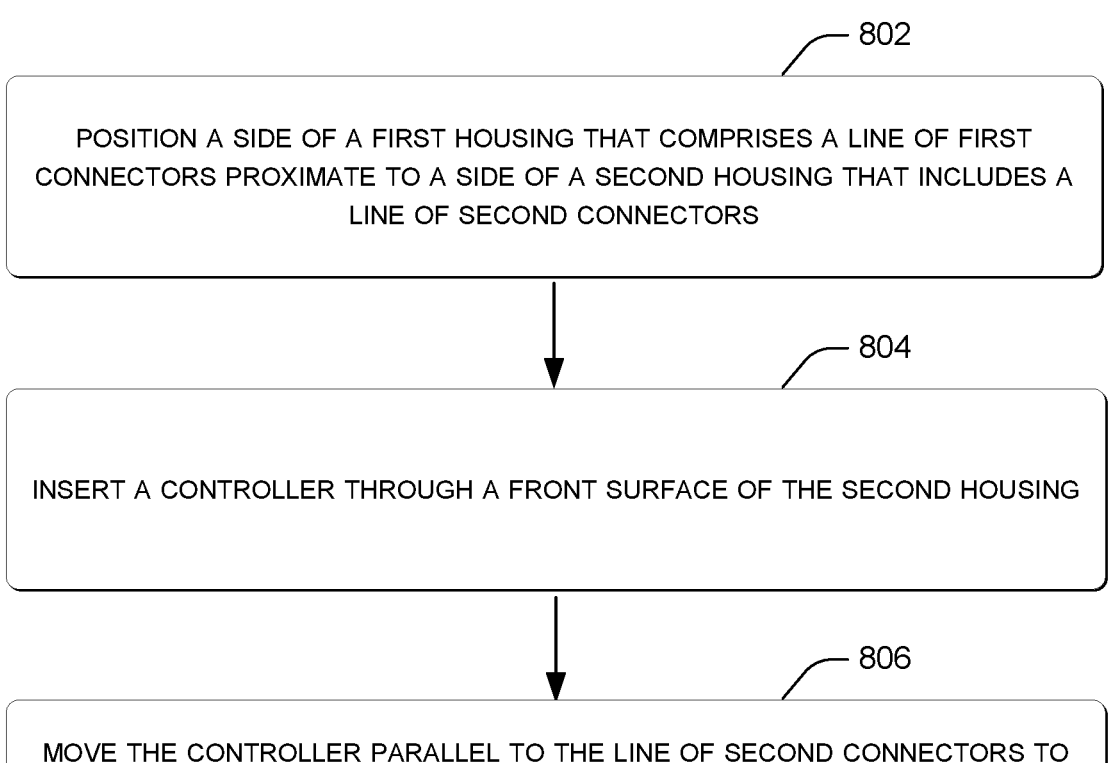

— 802

POSITION A SIDE OF A FIRST HOUSING THAT COMPRISES A LINE OF FIRST CONNECTORS PROXIMATE TO A SIDE OF A SECOND HOUSING THAT INCLUDES A LINE OF SECOND CONNECTORS

— 804

INSERT A CONTROLLER THROUGH A FRONT SURFACE OF THE SECOND HOUSING

— 806

MOVE THE CONTROLLER PARALLEL TO THE LINE OF SECOND CONNECTORS TO SEQUENTIALLY ENGAGE THE SECOND CONNECTORS TO ELECTRICALLY CONNECT THE LINE OF SECOND CONNECTORS TO THE LINE OF FIRST CONNECTORS

FIG. 8

HANDS-FREE CONNECTORS

BACKGROUND

Traditionally, electronic components have been connected manually with the user's hands, such as by connecting wires between the connectors or by directly connecting opposing connectors.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. In some cases, parentheticals are utilized after a reference number to distinguish like elements. Use of the reference number without the associated parenthetical is generic to the element. Further, the left-most numeral of each reference number conveys the figure and associated discussion where the reference number is first introduced.

FIG. 8 shows a flowchart of a connector method that can implement some of the present concepts in accordance with some implementations.

SUMMARY

The patent relates to connectors for connecting components of a system. One example can include a rectangular housing that has connectors positioned along at least one side. A single axis deployment mechanism can be configured to constrain movement of the connectors to a single axis. Upon receiving input from an angle that is perpendicular or oblique to the axis, the single axis deployment mechanism can be configured to cause the connectors to move sequentially from either of a stored position or a deployed position to the other of the stored position or the deployed position.

This summary is intended to give a quick introduction to some of the present concepts and is not intended to reflect all of the present concepts.

DETAILED DESCRIPTION

The present concepts relate to solutions for connector systems for connecting and disconnecting pairs of electrical connectors. The connector systems lend themselves to constrained spaces and opposing surfaces that block traditional access.

Figure 1A:
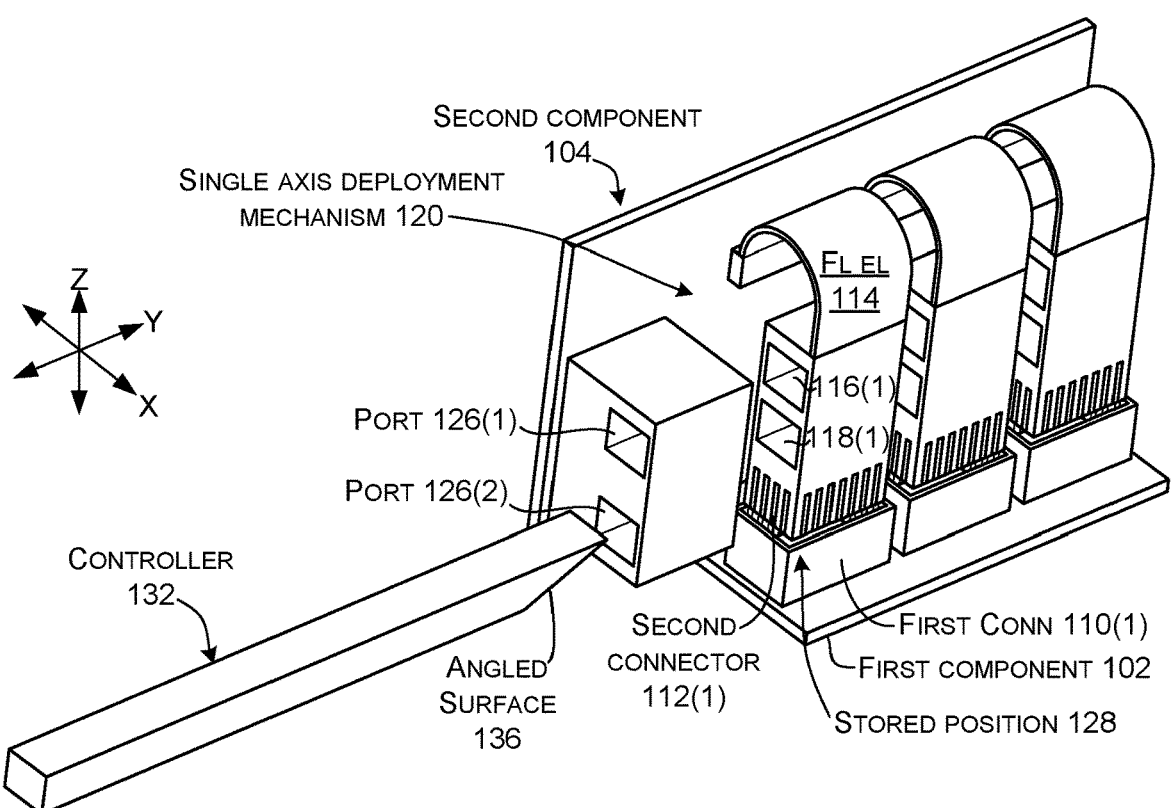
FIGS. 1A-1F, 6A, 6C, 7A, and 7B show perspective views of example connector systems in accordance with some implementations of the present concepts.
Figure 1B:
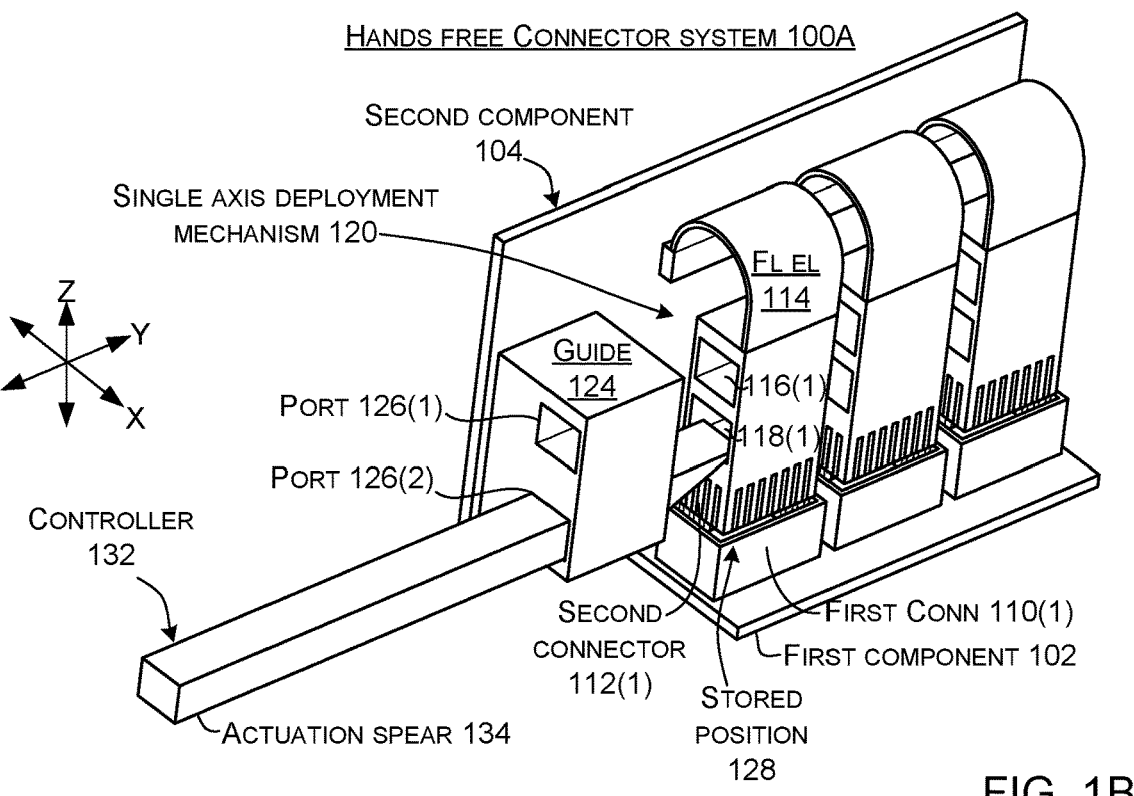
Figure 1C:
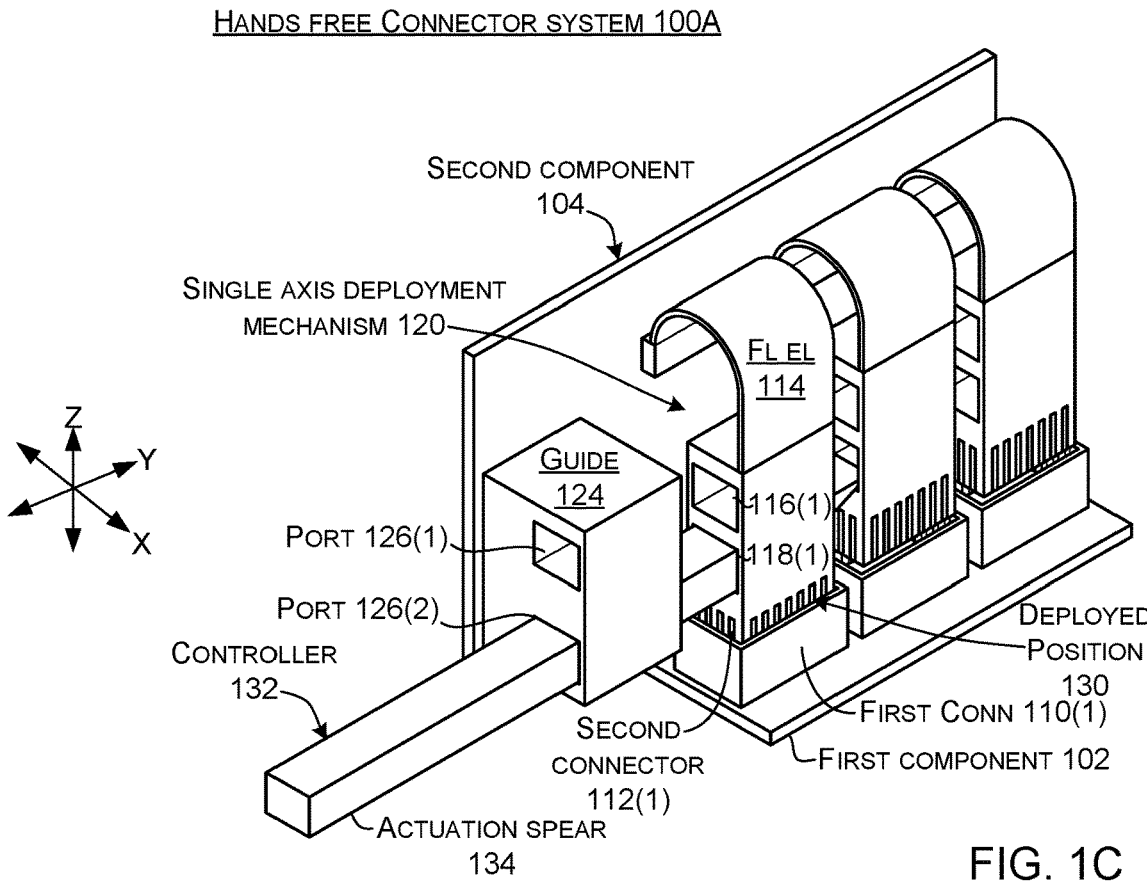
Figure 1D:
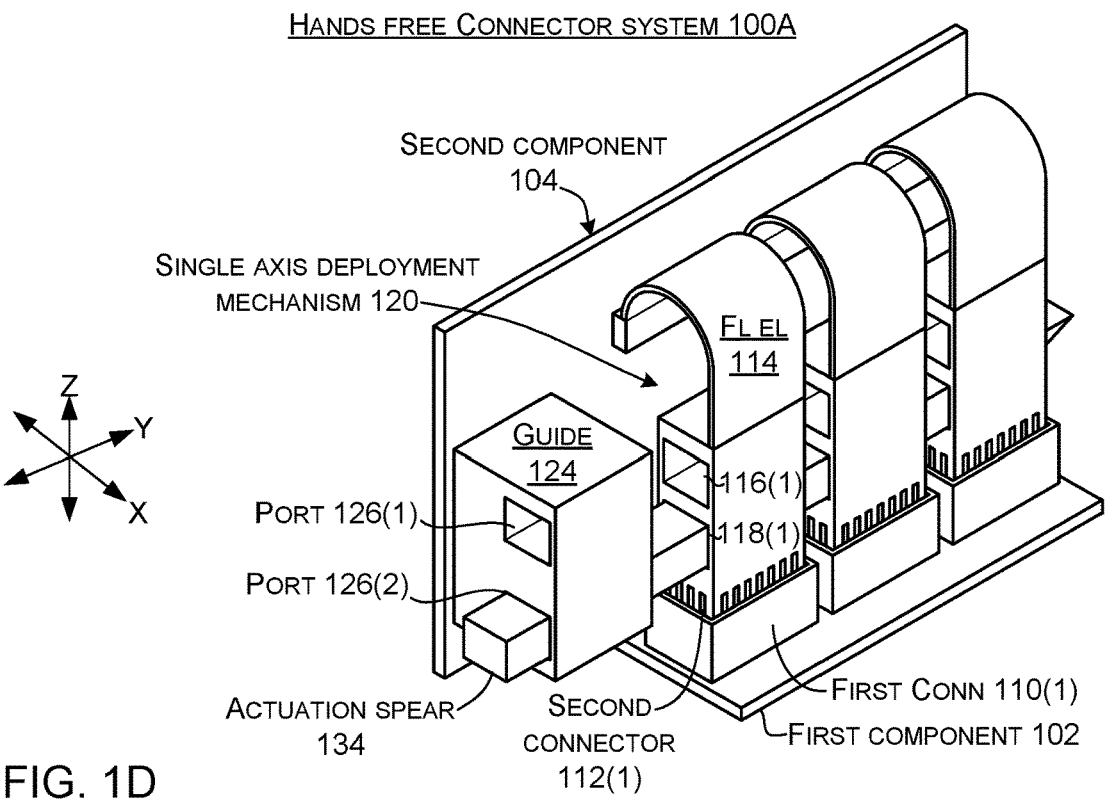
Figure 1E:
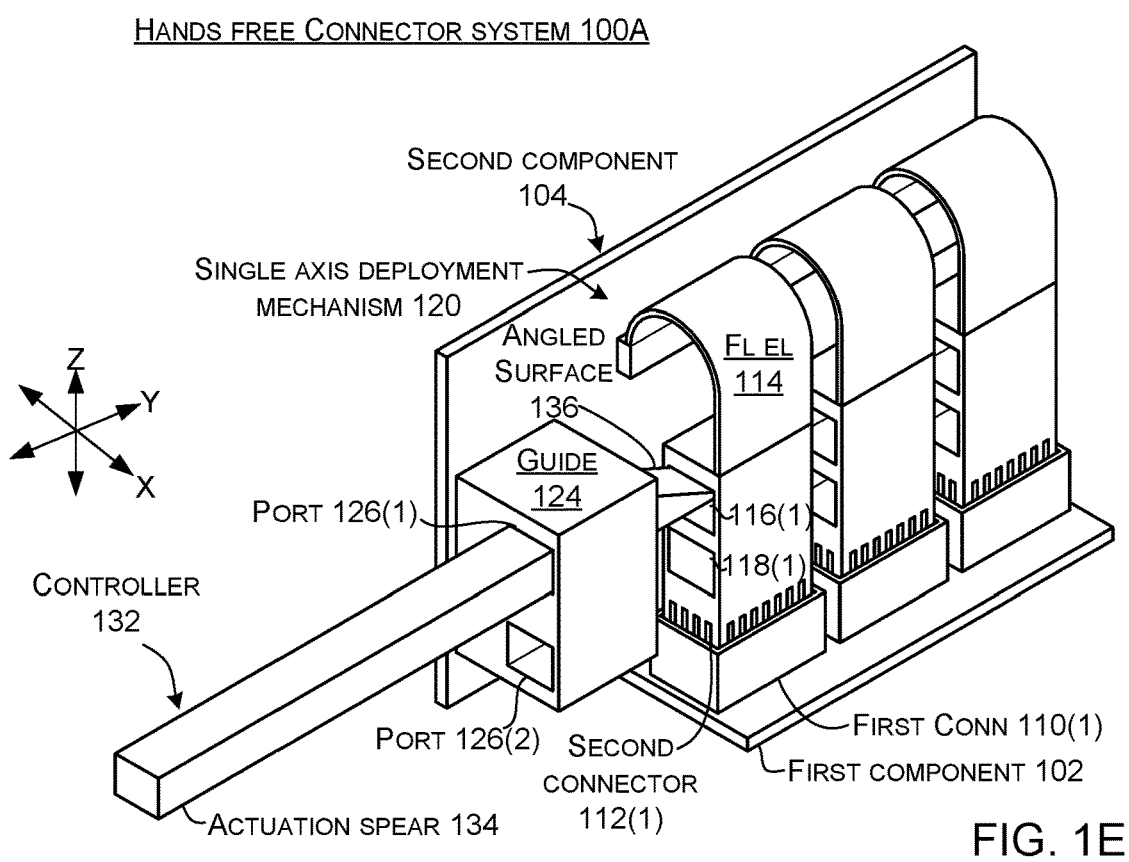
Figure 1F:
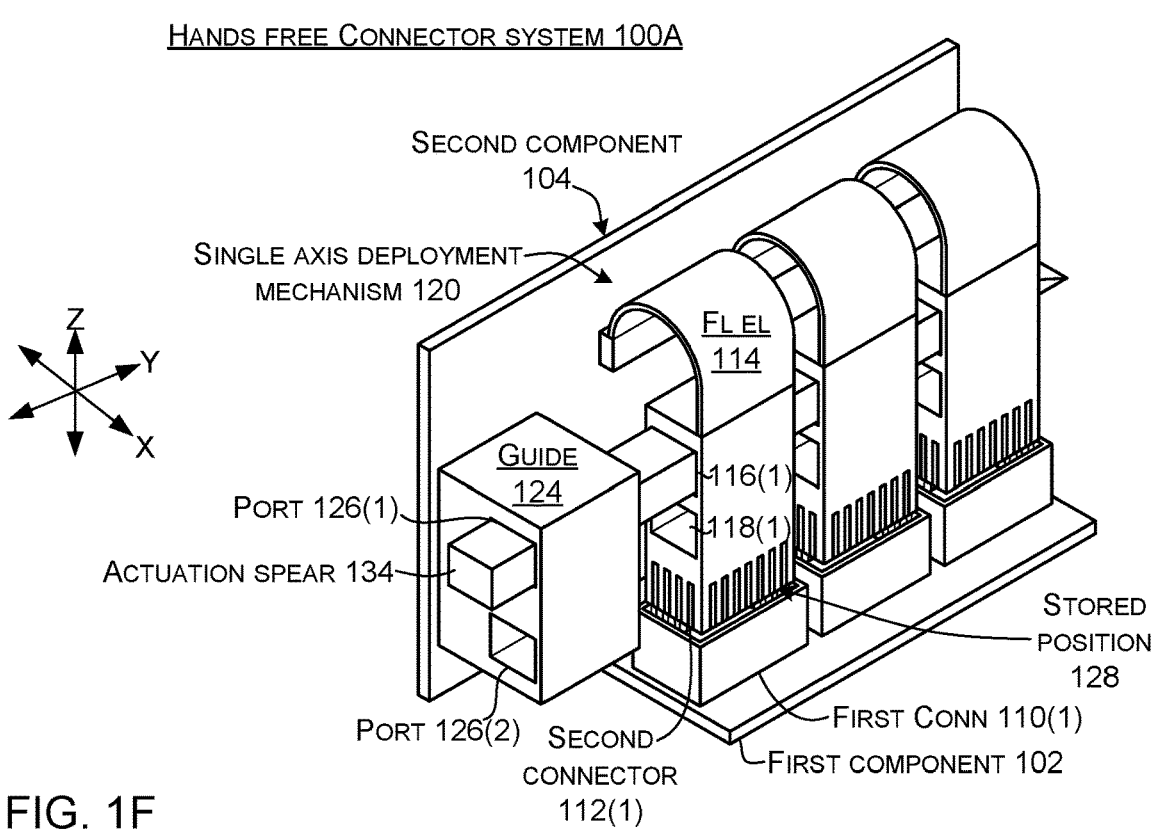
Figure 1G:
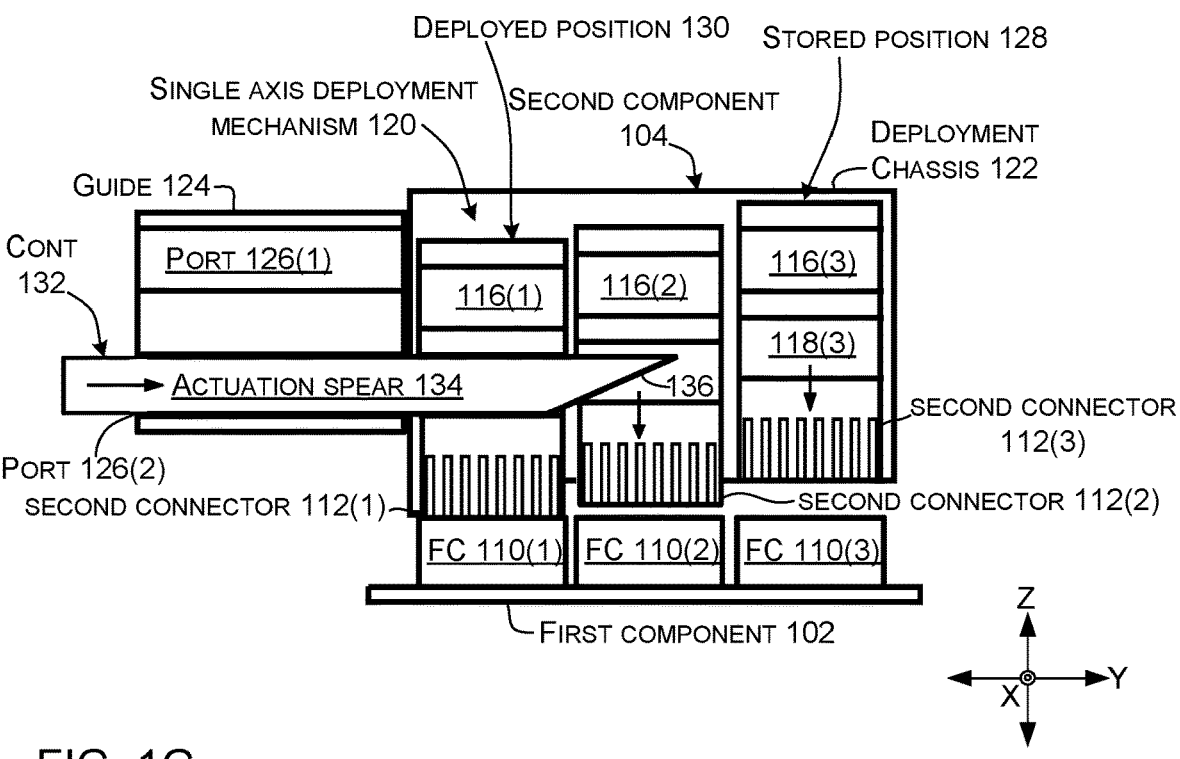
FIGS. 1G-1J, 2A-2D, 3A-3C, 4, 5A-5D, 6B, and 6D show elevational views of example connector systems in accordance with some implementations of the present concepts.
Figure 1H:
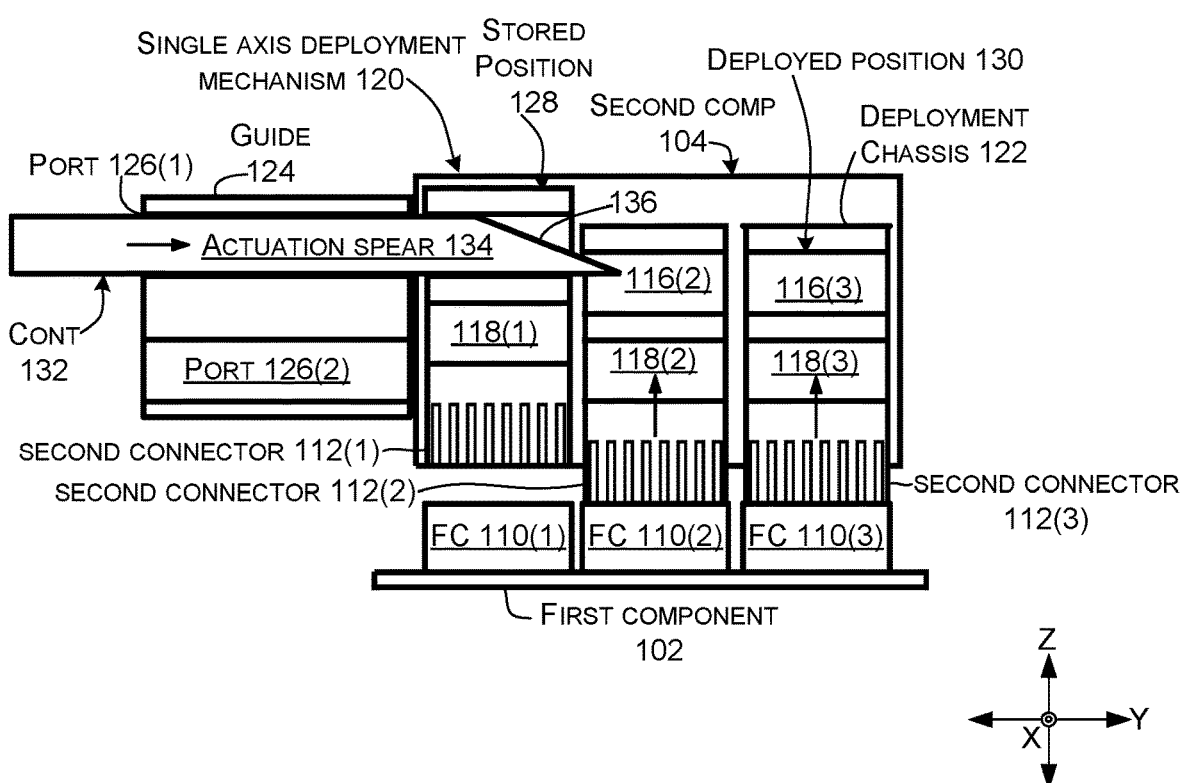
Figures 1I, 1J:
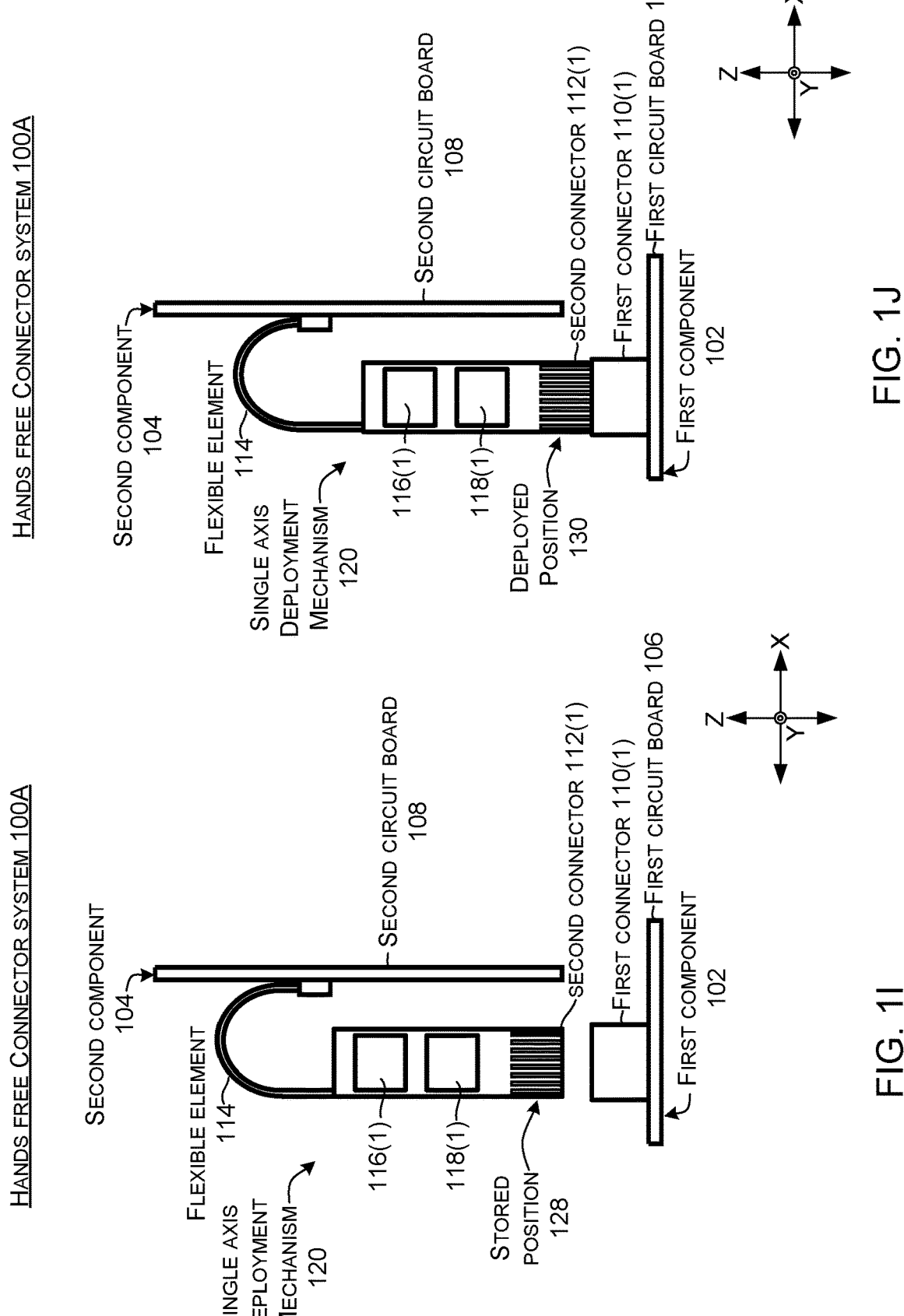

Introductory FIGS. 1A-1J collectively show a hands-free connection system 100 that is configured to selectively connect first and second components 102 and 104. Note that FIGS. 1A-1F show a sequence of use case snapshots and not every instance of every element is labelled to avoid clutter on the drawing pages. FIGS. 1G and 1H are elevational views taken along the y reference axis (e.g., side view). FIGS. 1I and 1J are elevational views taken transverse to the y reference axis (e.g., front view). Each element is labelled on FIGS. 1G-1J to the extent practical.

In this example, the first and second components 102 and 104 are manifest as first and second electronic circuit boards 106 and 108. The first circuit board 106 is electrically connected to a first connector 110. The second circuit board 108 is electrically connected to a second connector 112 by a flexible element 114. The second connector 112 defines upper and lower holes 116 and 118. In this case, upper holes 116 are relatively farther from the respective first connector 110 than the lower holes 118 that are relatively closer to the respective first connector 110. This implementation employs three second connectors 112 that can be connected and disconnected from three corresponding first connectors 110 to function as three connector pairs. However, the present concepts can be employed with any number of connector pairs, such as a single connector pair, two connector pairs, and/or more than three connector pairs including tens or hundreds of connector pairs. For instance, FIGS. 2A-2D show an implementation with 1I connector pairs.

A single axis deployment mechanism 120 is configured to constrain movement of second connector 112 and aligns the second connector 112 relative to the first connector 110. The single axis deployment mechanism 120 constrains movement of second connector 112 to a single axis, which in this case is the z reference axis (e.g., toward and away from the first connector 110). The single axis deployment mechanism 120 blocks movement of second connectors 112 in other directions and prevents other motion, such as rotational motion.

In this implementation, the single axis deployment mechanism 120 is manifest as a deployment chassis 122 and a guide 124. The guide 124 includes upper and lower ports 126. The deployment chassis 122 supports the second connector 112 and allows the second connectors 112 to move in the z reference direction within the deployment chassis 122 but blocks other movement. The guide 124 is fixed adjacent to the deployment chassis 122. In this case, the guide is fixed to the deployment chassis 122 so that the ports 126 are perpendicular to the direction of motion of the second connector 112 (e.g., perpendicular to the z reference direction).

The single axis deployment mechanism 120 offers a technical solution that allows input to be applied from an angle that is perpendicular or oblique to the axis of movement of the second connectors 112 to cause the second connectors 112 to move between a stored or disconnected position 128 (labelled relative to second connector 112(1) in FIG. 1A) to a deployed or connected position 130 (labelled relative to second connector 112(1) in FIG. 1C). In this example, the input for effecting the state of the second connector 112 is imparted on the single axis deployment mechanism 120 by a controller 132, such as in the form of an actuation spear 134.

The actuation spear 134 includes an angled surface 136 that forms an acute angle relative to the direction of insertion of the actuation spear 134 (e.g., the y reference direction). In an alternative implementation, the controller 132 is manifest as a cam mechanism. For example, a rod can have three cam lobes dedicated to each second connector 112. When the rod is rotated a partial turn, the cams actuate each of the second connectors 112 individually. If rotation is continued, the cams would dis-engage the second connectors 112 in a similar manner.

Insertion of the actuation spear 134 in the lower port 126(2) with the angle surface 136 facing downward (e.g., toward the first connector 110) causes the angled surface to sequentially enter lower hole 118 of each second connector 112 and to force or move the second connectors 112 downward (e.g., toward the respective first connectors 110). This aspect is shown in the sequence of FIGS. 1A-1D and FIG. 1G where the actuation spear 134 is being moved from left to right along the y reference axis. Note that while there are two holes 116 and 118 in the second connectors 112 and two ports 126 on the guide 124, the spacing between the two holes is different from the spacing between the two ports. The guide 124 is fixed in place, so as the actuation spear 134 moves along the y reference axis, the angled surface forces the hole that it enters to move in the z reference direction until it is aligned with the port.

In FIG. 1A, the actuation spear 134 is shown proximate to port 126(2). All of the second connectors 112 are in the stored position 128. Note that some implementations may employ a detent mechanism to maintain the second connectors 112 in the stored position. In FIG. 1B, the actuation spear 134 is beginning to engage hole 118(1) of second connector 112(1) and will overcome the detent mechanism (if utilized). In FIG. 1C, the actuation spear 134 has transitioned second connector 112(1) to the deployed position 130 where it is connected to first connector 110(1). The actuation spear 134 is starting to engage the next connector 112(2). In FIG. 1D, the actuation spear 134 has transitioned all of the second connectors 112 from the stored position 128 of FIG. 1A to the deployed position 130 to connect with the corresponding first connectors 110.

FIGS. 1E and 1F show the reverse process where the actuation spear 134 is installed in port 126(1) with the angled surface 136 facing upwards (e.g., away from the first connectors 110). The actuation spear 134 will sequentially force the second connectors 112 to transition back to the stored position 128. Note that some implementations can employ a key mechanism between the spear 134 and the ports 126 so that the spear can only be inserted in the proper orientation (e.g., angled surface 136 down in port 126(2) and angled surface 136 up in port 126(1)).

FIGS. 1G-1J show these aspects in more detail. As shown in FIG. 1G angled surface 136 has already passed through the lower hole 118(1) of second connector 112(1) and forced it downward into a deployed position 130 where it completes a connection with first component 110(1). The angled surface 136 is now contacting the lower wall of lower hole 118(2) of second connector 112(2) and is moving the second connector 112(2) toward the respective first connector 110(2) (e.g., the second connector 112(2) is transitioning from the stored position towards the deployed position). The second connector 112(3) is still in the stored position 128 because it has yet to be contacted by the angled surface 136 of the actuation spear 134. Thus, FIG. 1G shows the actuation spear 134 sequentially transitioning the second connectors 112 from the stored position 128 to the deployed position 130 (e.g., from the unconnected configuration to a connected configuration where the second connectors 112 complete a connection with the respective first connectors 110).

FIG. 1H shows the actuation spear 134 sequentially uncoupling the second connectors 112 from the respective first connectors 110. In FIG. 1H, the actuation spear 134 has been flipped over so the angled surface 136 faces away from the first connectors 110 and inserted in the upper port 126(1). Linear movement of the actuation spear 134 in the y reference direction creates a force in the z reference direction on each sequential second connector 112. In the snapshot of FIG. 1H, the actuation spear's angled surface 136 has already created a force on the upper hole 116(1) of second connector 112(1) and moved the second connector 112(1) away from the corresponding first connector 110(1) from the deployed position 130 to the stored position 128 (e.g., disconnected the second connector 112(1) from the first connector 110(1)). The actuation spear's angled surface 136 is engaging the upper hole 116(2) of the middle second connector 112(2) and is moving the second connector 112(2) up and away from first connector 110(2). The actuation spear's angled surface 136 has not yet engaged the last second connector 112(3), which remains in the deployed position (e.g., completing a connection with first connector 110(3)).

FIGS. 1I and 1J show front elevation views of second connector 112(1) with the guide 124 removed. FIG. 1I shows the second connector 112(1) in the stored position 128 (e.g., disconnected from first connector 110(1)). FIG. 1J shows the second connector 112(1) in the deployed position 130 (e.g., engaging with and connected to the corresponding first connector 110(1)).

In this implementation, the single axis deployment mechanism 120 provides a technical solution that allows the actuation spear 134 to be forced into the guide 124 and the deployment chassis 122 (in the y reference direction) to sequentially transition the second connectors 112 (in the z reference direction) from either the stored position 128 to the deployed position 130 or vice versa.

FIGS. 2A-2D show another hands-free connector system 100B that includes example single axis deployment mechanism 120. This implementation employs 11 first connectors 110(1)-110(11) and second connectors 112(1)-112(11). To avoid clutter on the drawing page only representative connectors are specifically designated. In this case, first component 102 and first connectors 110 are positioned in a first housing 202(1). Second component 104 and second connectors 112 are connected by flexible elements 114 and are positioned in a second housing 202(2). In this implementation, the housings 202 are rectangular shaped, though other shapes can be employed.

Figures 2A, 2B:
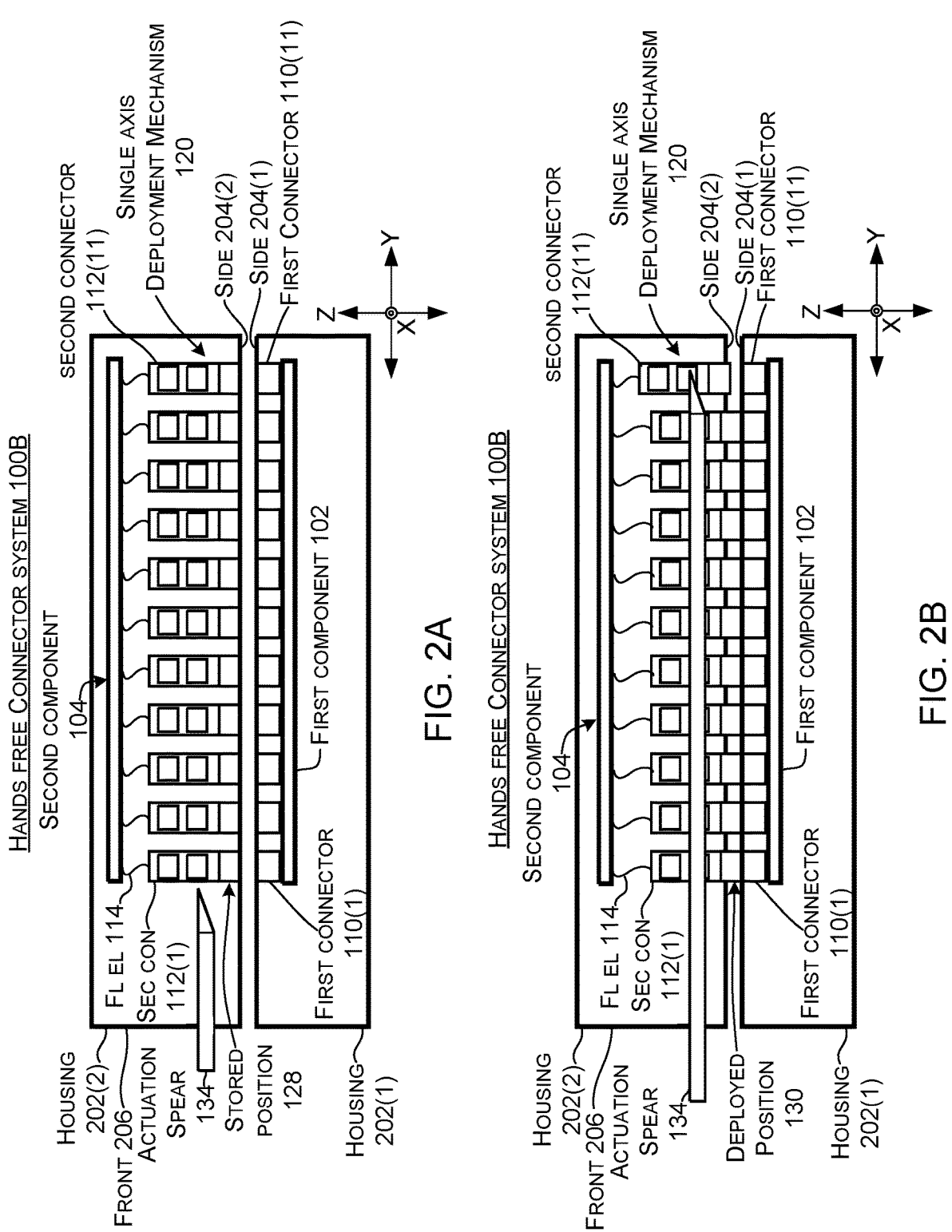
Figure 2C:
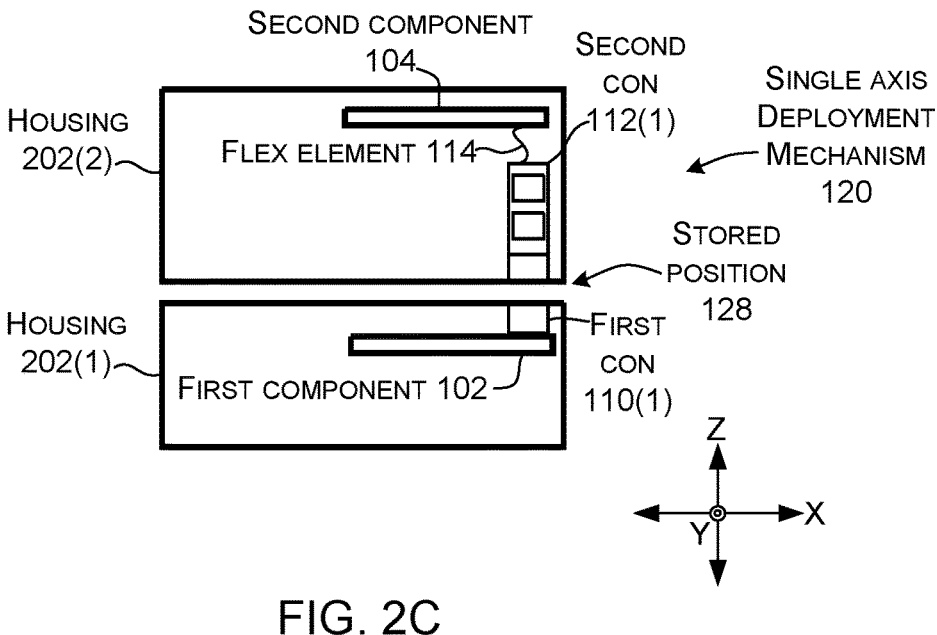
Figure 2D:
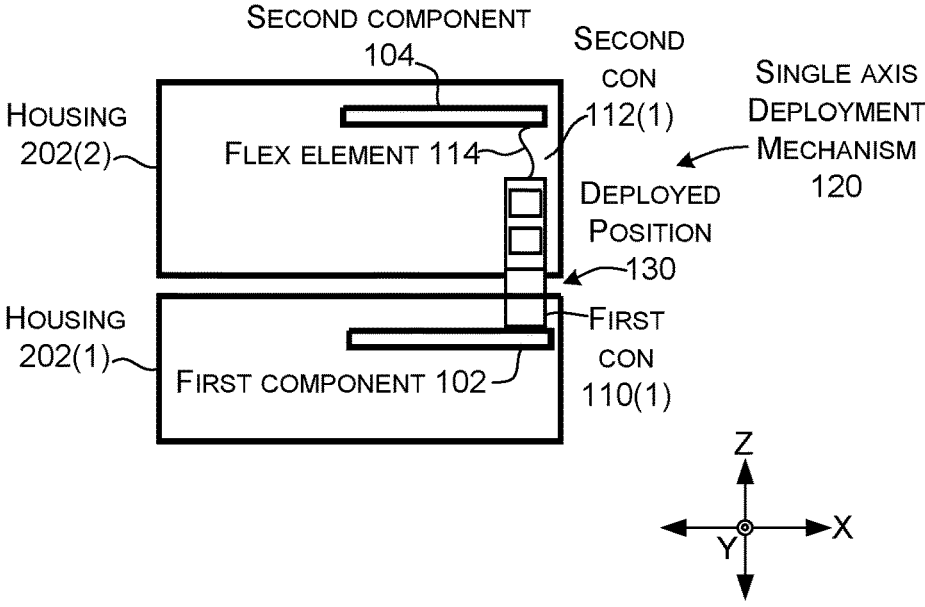

FIGS. 2A and 2C show the first connectors 110 contained in the first housing 202(1). The second connectors 112 are in the stored position 128 and are contained in the second housing 202(2). FIGS. 2B and 2D show the actuation spear 134 forcing the second connectors 112 from the stored position 128 to the deployed position 130. In the deployed position, the second connectors 112 extend from the second housing 202(2) against and into the first housing 202(1) to complete the connections.

This implementation provides a technical solution that sides 204 of the two housings 202 can be positioned proximate to one another and even against one another. The actuation spear 134 can be inserted into a front side 206 to deploy the second connectors 112 from the second housing 202(2) to the first housing 202(1) to complete the connections with the respective first connectors 110 without engaging either of the opposing sides. Instead, connecting and disconnecting the two housings can be accomplished exclusively through the front side 206. As such, the hands-free connector system 100B employing the single axis deployment mechanism 120 offers a technical solution that enables device geometries that are not feasible with existing inter-device (e.g., between housings) connection systems that require access to one or both of sides 204(1) and 204(2) to connect or disconnect the first and second connectors 110 and 112.

Figure 3A:
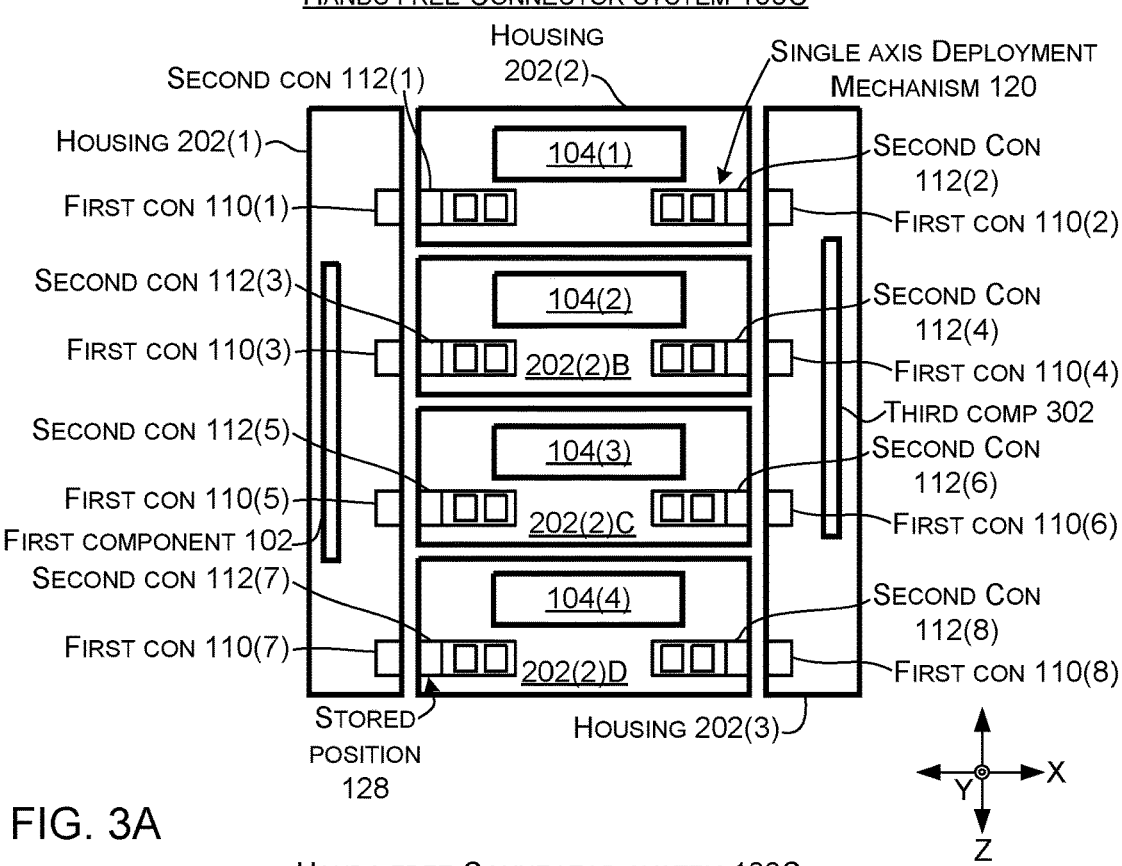
Figure 3B:
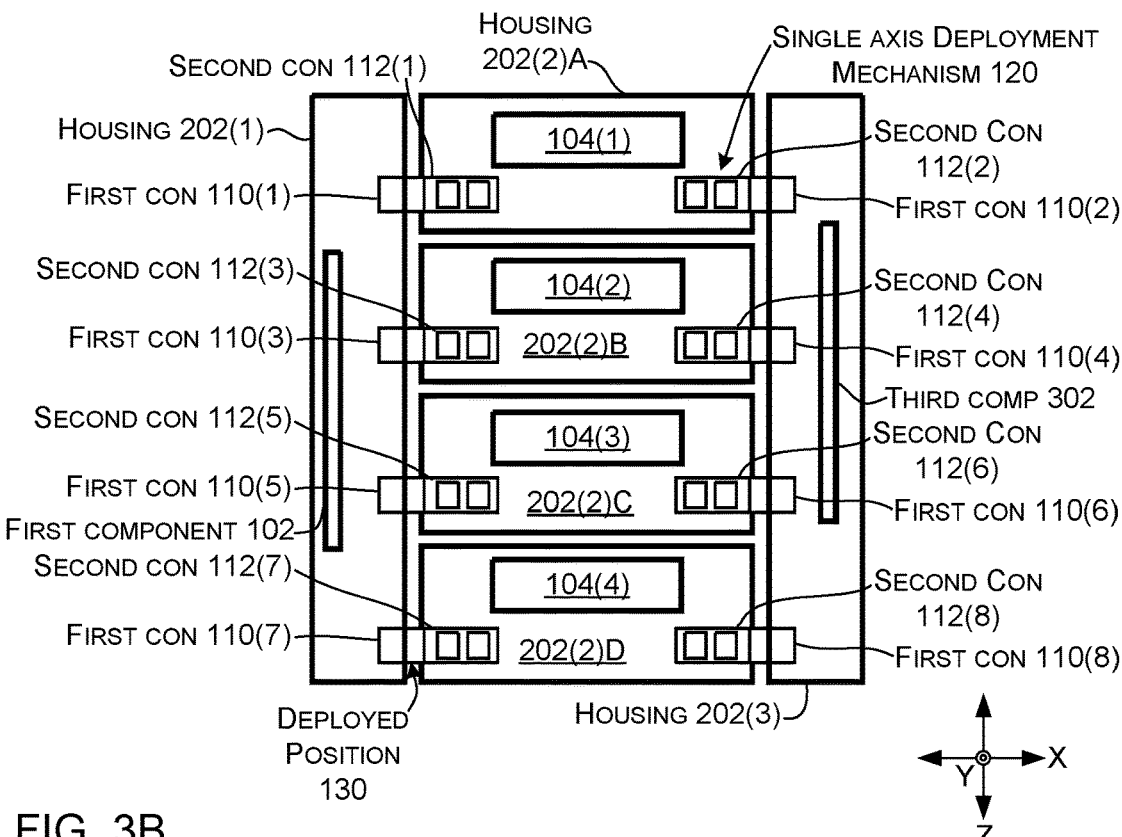
Figure 3C:
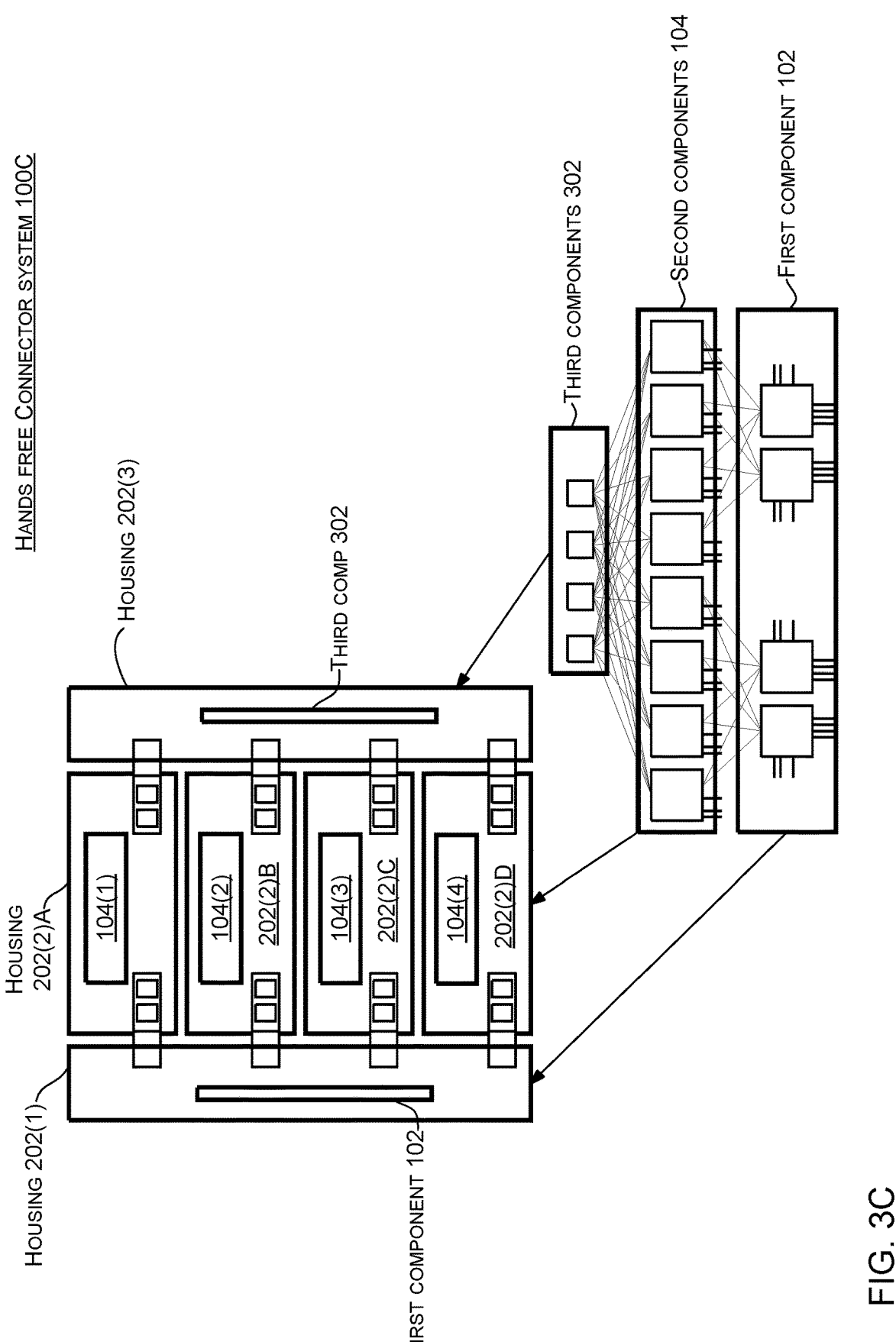

FIGS. 3A-3C collectively show another hands-free connector system 100C that includes example single axis deployment mechanism 120. The single axis deployment mechanism 120 allows a system geometry that is not practical with existing connection systems because there is not room for the user's hands to connect and/or disconnect first connectors 110 and second connectors 112. For instance, hands-free connector system 100B can enable a high-density disaggregated computer configuration that is not possible where the user has to access sides of the device that are being connected and disconnected. This example includes three housings 202(1), 202(2), and 202(3). In this implementation, each housing contains a specific type of component. For purposes of explanation, assume that first component 102 in housing 202(1) is manifest as computer storage, such as a solid-state drive, second component 104 in housing 202(2) is manifest as a processor, and third component 302 is manifest as memory.

The illustrated configuration employs four identical horizontally stacked housings 202(2)A-202(2)D. While four stacked housings 202(2) are illustrated for purposes of explanation, the present concepts can apply to any number of housings 202(2). Each stacked housing 202(2) includes an instance of second component 104 (e.g., a processor in this example). The stacked housings 202(2) are bound on opposing sides by vertically oriented housing 202(1) and vertically oriented housing 202(3). This geometric arrangement allows the sides of each stacked housing to be adjacent to both housing 202(1) and housing 202(3). Thus, second connectors 112 can be positioned on each opposing side of the housings 202(2) to allow connection to first component 102 and third component 302 via single axis deployment mechanism 120.

In the illustrated configuration, an instance of second connectors 112 is positioned on opposing vertical side of housings 202(2) to connect to first connectors 110 positioned on housing 202(1) and housing 202(3). Note that the connectors could be switched, with the first connectors on housing 202(2) and the second connectors on housing 202(1) and 202(3). Note while not visible in these front elevational views, behind each illustrated first connector/second connector pair could be a line of more pairs stretching along the y reference axis similar to those shown in FIGS. 1G, 1H, 2A, and 2B.

FIG. 3A shows all of the second connectors 112 in the stored position 128. To connect the second connectors 112 to the respective first connectors 110 the user does not need access to the opposing sides where the first and second connectors 110 and 112 are located. Instead, the user can insert the actuation spear 134 (not specifically shown here, but shown in FIGS. 1A-1F) through the front side (e.g., the side facing the reader in FIGS. 3A and 3B). The actuation spear 134 traveling along the y reference axis (e.g., into the printed page that FIGS. 3A and 3B appear on) will sequentially encounter second connectors 112 and transition the second connectors 112 from the stored position 128 of FIG. 3A to the deployed position 130 of FIG. 3B.

The deployed position 130 of FIG. 3B causes each of the processors (e.g., second components 104) located in the stacked housings 202(2) to be connected to the storage (e.g., first components 102) located in the housing 202(1) and the memory (e.g., third components 302) located in housing 202(3)). Thus, the storage of housing 202(1) and the memory of housing 202(3) are shared resources for all of the processors of housings 202(2)A-202(2)D.

FIG. 3C shows the hands-free connection system 100C in the state shown in FIG. 3B and as such, some of the designators are removed. FIG. 3C also adds a schematic representation of the interconnectedness of the first components 102, second components 104, and third components 302 offered by the hands-free connector system 100C to create a disaggregated computer architecture. While some components, such as memory and storage are shared in the illustrated configuration, other configurations can provide dedicated memory and storage for each processor in a one-to-one-to-one or other ratio as desired.

The present hands-free connector system 100C provides a technical solution for ease of serviceability despite the cramped volume of the housings, which are likely too small for a user to use their hands to connect and disconnect the components. Instead, the technical solution is achieved with the single axis deployment mechanism 120. If any of the components need servicing or replacement, the user can employ the actuation spear 134 from the front surface to disconnect the affected connections to allow removal of the affected housing (e.g., the housing can be removed toward the user out of the drawing page). The user does not need access to the sides of the housings as would be required with traditional technologies. The affected housing can then be reinstalled or replaced from the front side and reconnected with the actuation spear 134 as explained above.

Figure 4:
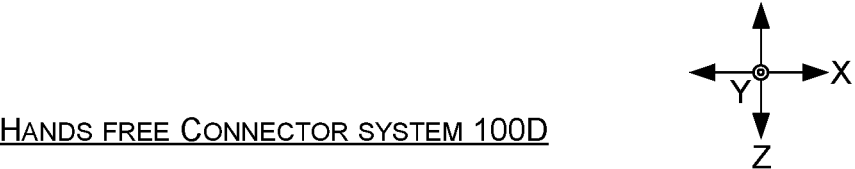
Figure 4:
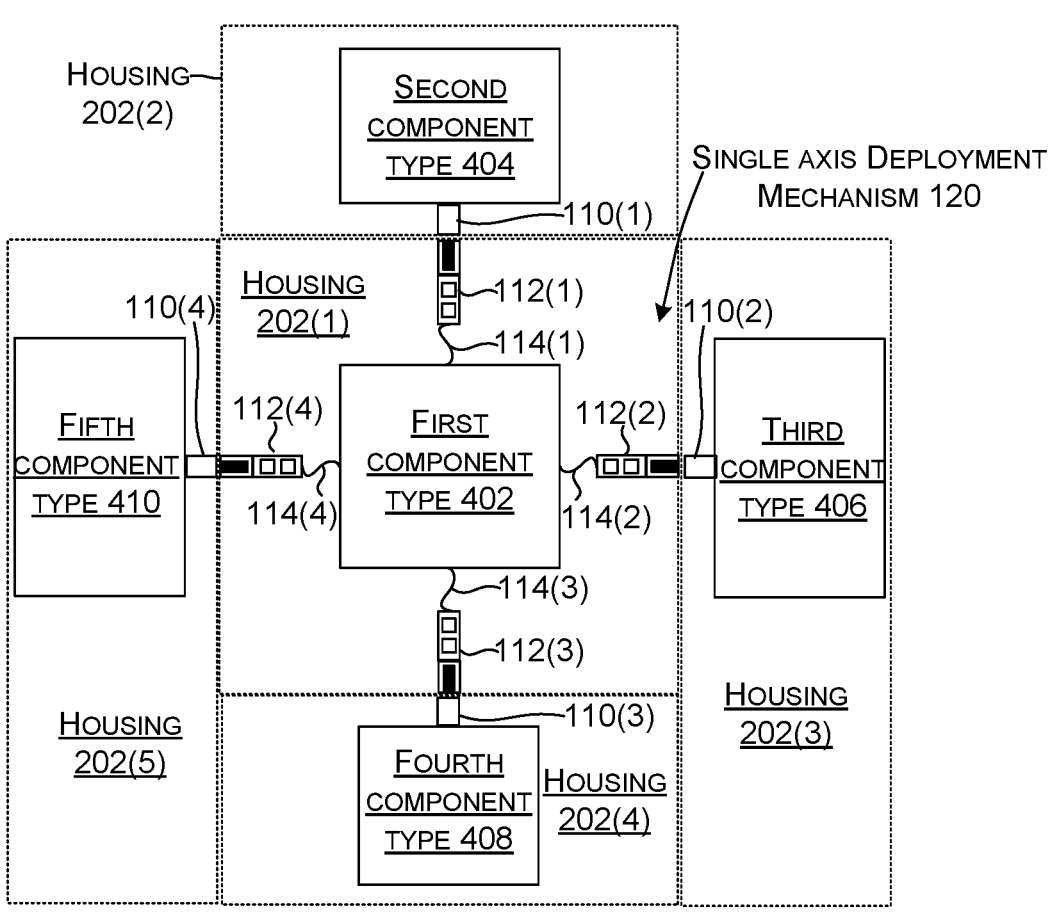

FIG. 4 shows another example hands-free connector system 100D that includes example single axis deployment mechanism 120. This configuration includes a central rectangular housing 202(1) that contains a first component type 402. Both sides and the top and bottom are bordered by housings 202(2)-202(5) that each contain a single component type 404, 406, 408, and 410, respectively. For instance, the first component type 402 could be central processing units (CPUs), the second component type could be graphics processing units (GPUs), the third component type could be memory, the fourth component type could be storage, and the fifth component type could be accelerators, for example.

Each of the component types 404-410 is connected to the first component type 402 along a conductive path. Each conductive path is defined by the flexible element 114, second connector 112, and first connector 110 between the first component type 402 and each of the other component types 404-410. In this configuration, each of the conductive paths is approximately equal in length, such as +/−10%, for example. Further, the path length can be very short for two reasons. First, access along the abutting sides of the housing is not required because all connecting and disconnecting can be achieved with the actuation spear (not shown in FIG. 4) along the y reference axis (e.g., from the front of the device into the printed drawing page towards the back of the housing). Here, interconnected sides of five different housings 202 are abutting one another. Traditional connection technologies would not allow this configuration and would place connections in the back of the housings with longer paths, such as with wires connecting them. Second, the connections along the sides of the housings do not impede airflow through the device from front-to-back or back-to-front to remove thermal load created by the components. In contrast traditional connections at the back of the housing impede linear airflow through the housings. The present concepts lend themselves to other cooling scenarios as will be discussed below.

Figure 5A:
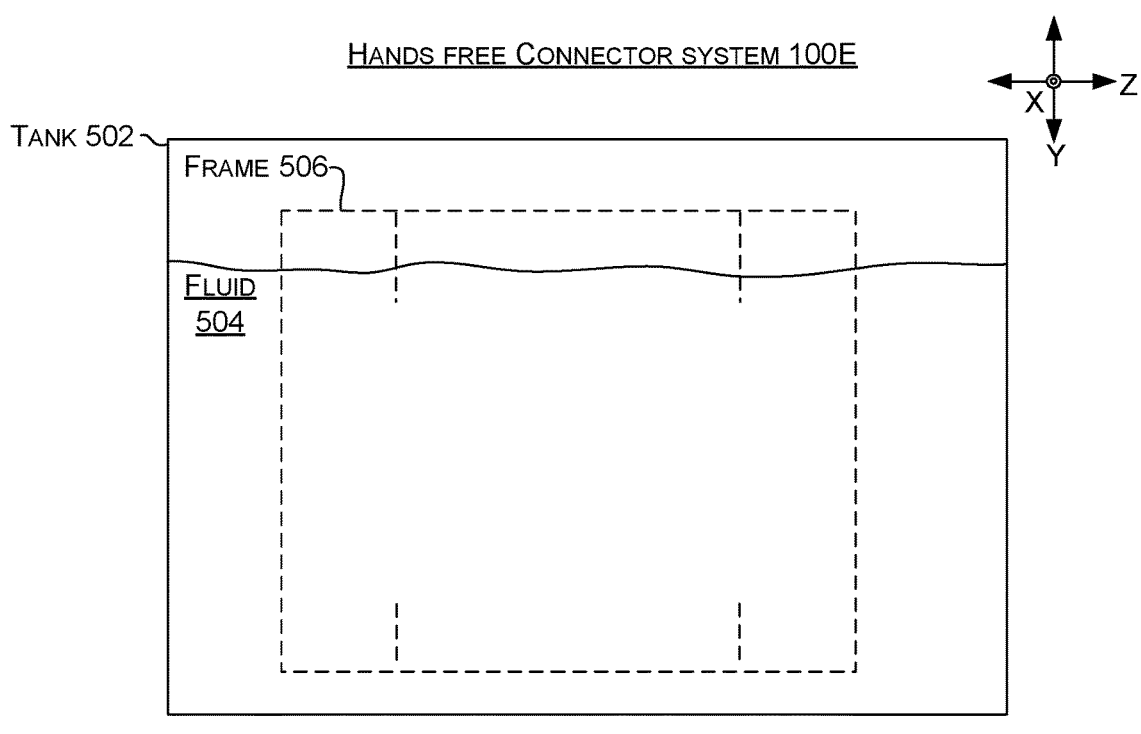
Figure 5B:
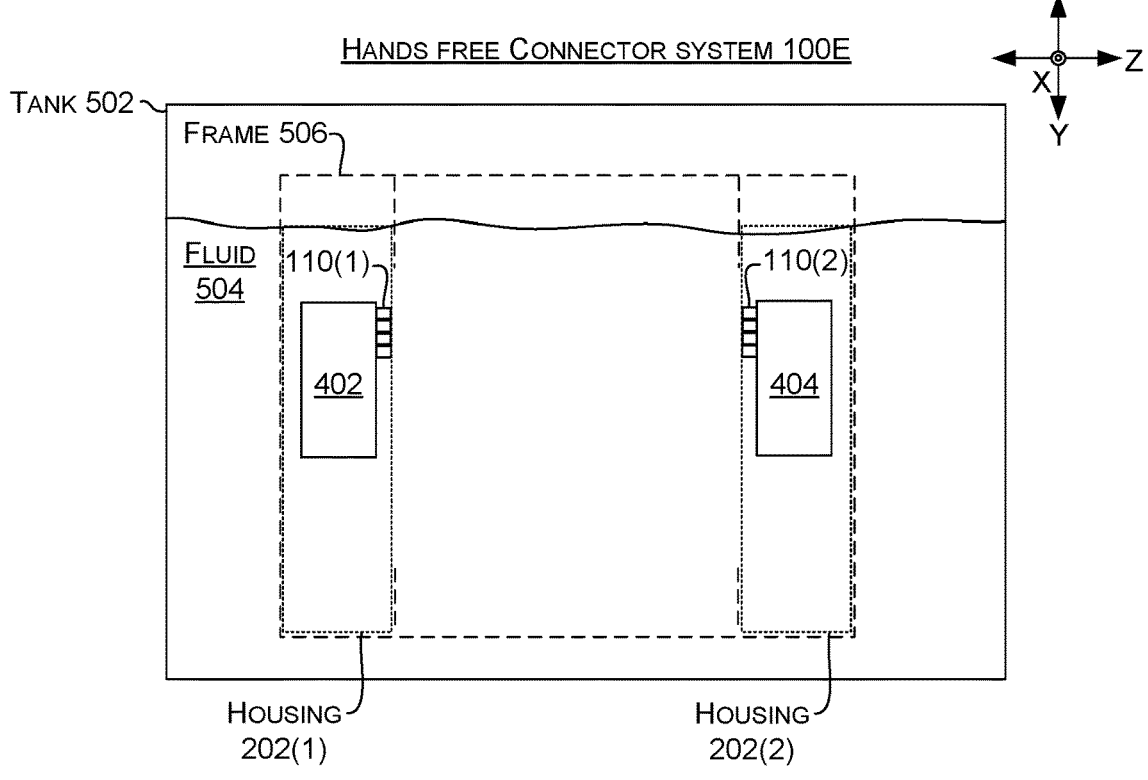
Figure 5C:
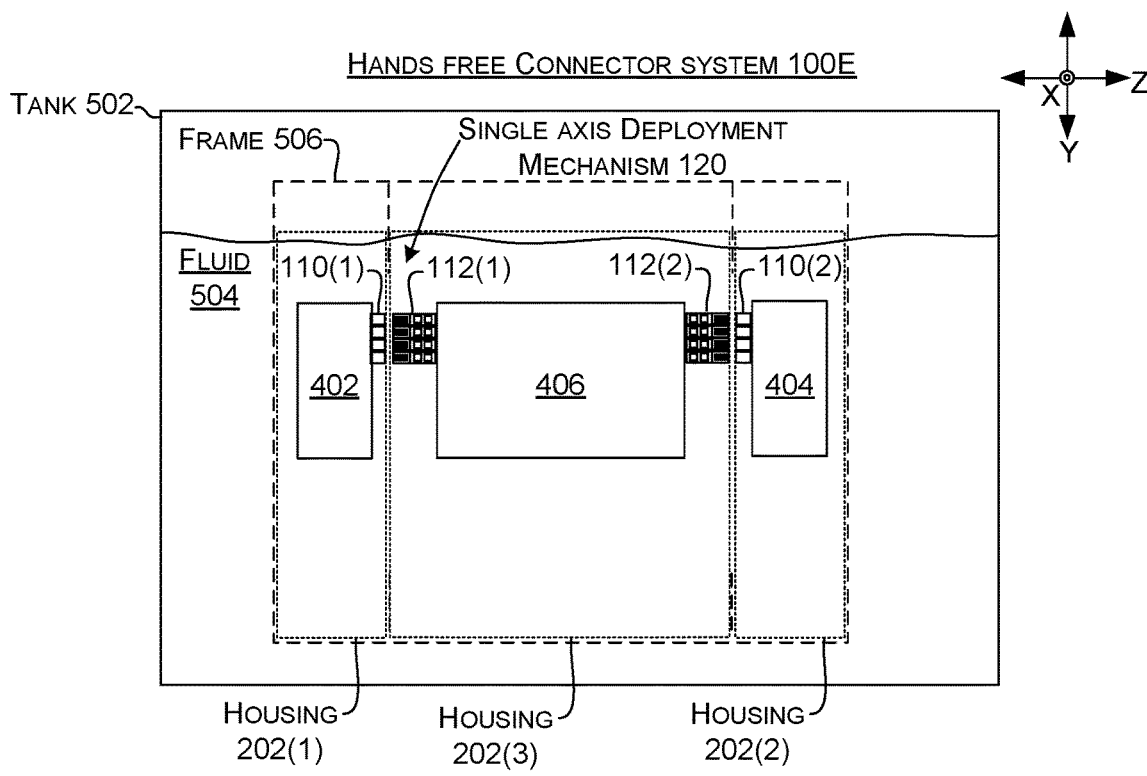
Figure 5D:
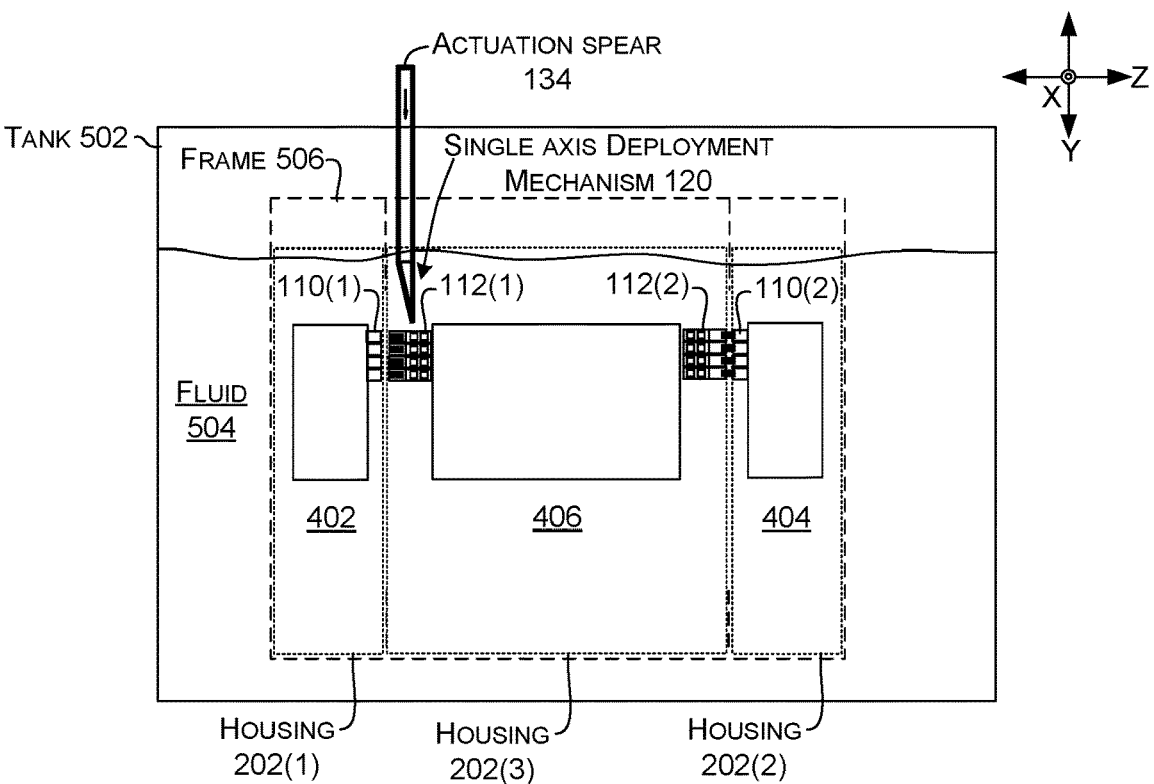

FIGS. 5A-5D collectively show another example hands-free connector system 100E that includes example single axis deployment mechanism 120 (FIGS. 5C and 5D). As shown in FIG. 5A, this example includes an immersion tank 502 that contains cooling fluid 504. A flow-through frame 506 for holding housings 202 is positioned in the immersion tank 502.

FIG. 5B shows housing 202(1) positioned on the left side of the flow-through frame 506 and housing 202(2) positioned on the right side of the flow-through frame 506. Housing 202(1) can include components of a first component type 402 that are connected to first connectors 110(1). Housing 202(2) can include components of a second component type 404 that are connected to first connectors 110(2).

FIG. 5C shows another housing 202(3) positioned in the flow-through frame between the first and second housing 202(1) and 202(2). Housing 202(3) includes components of a third component type 406 that are connected to second connectors 112(1) and 112(2).

FIG. 5D shows how the present concepts allow the different component types to be connected and disconnected without the user putting their hands in the tank, draining the tank or other inconveniences. The present concepts provide a technical solution where the actuation spear 134 can be lowered into the tank from above the fluid 504 to sequentially transition the second connectors 112 from either of the storage position to the deployed position to the other of the storage position or the deployed position. Note that the actuation spear 134 is not shown to scale with the second connectors 112.

In FIG. 5D, second connectors 112(2) are shown in the deployed position, thus connecting components in housing 202(3) with those in housing 202(2). Second connectors 112(1) are shown in the stored position. The actuation spear 134 can be lowered into the tank 502 in the y reference direction and can sequentially transition second connectors 112(1) to the deployed position. If components need to be replaced, they can be disconnected with the actuation spear 134 and the respective housing can be lifted out of the tank. The replacement housing can be installed and then connected with the actuation spear 134 from above the immersion tank 502 (e.g., only the actuation spear is lowered into the tank to connect pairs of couplers on two housings). The force of the actuation spear 134 can sequentially transition the state of the second connectors 112 by moving them in the z reference direction.

Figure 6A:
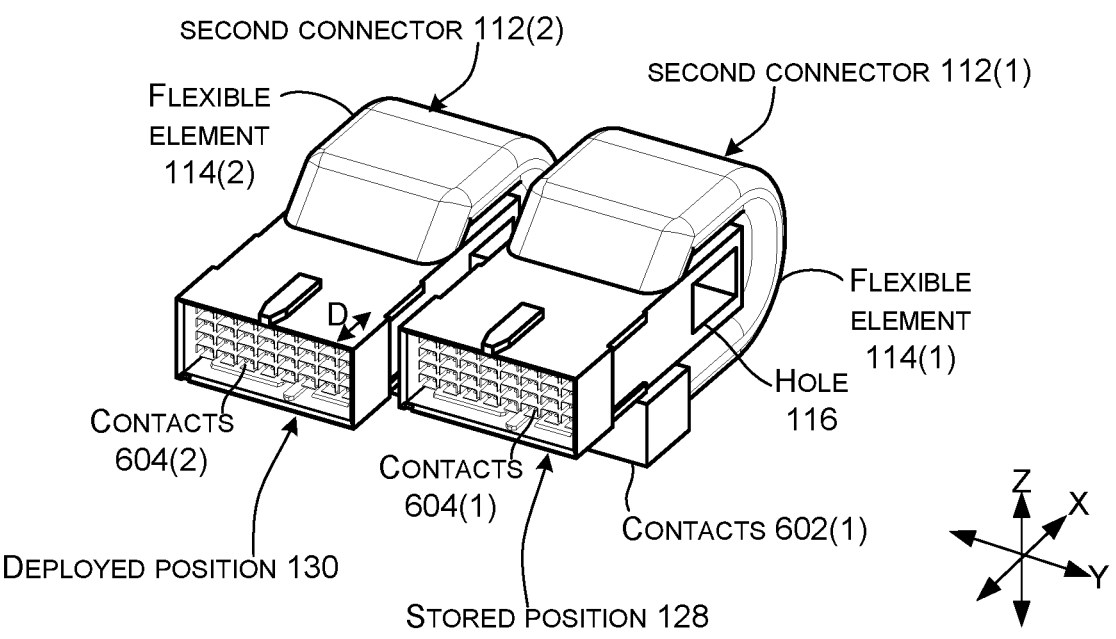
Figure 6B:
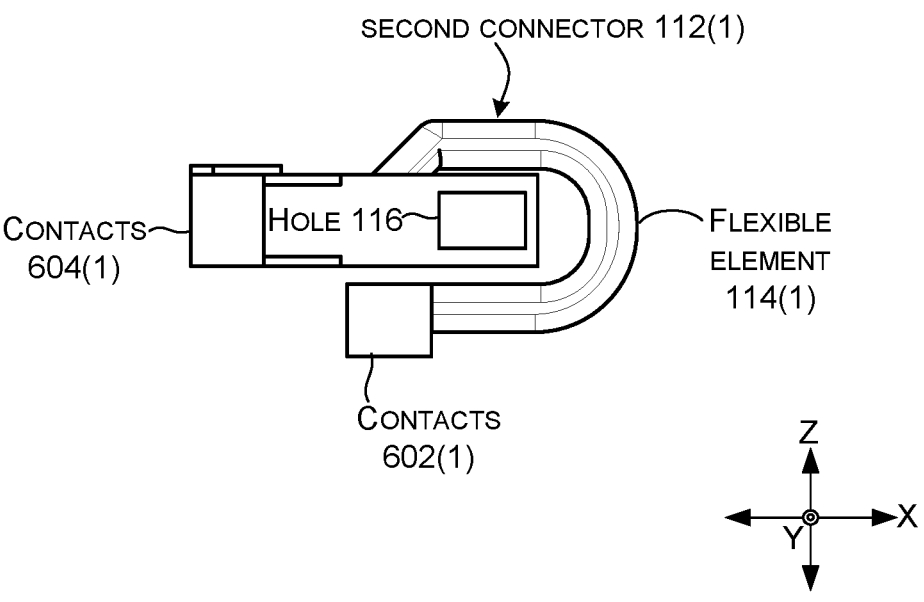
Figure 6C:
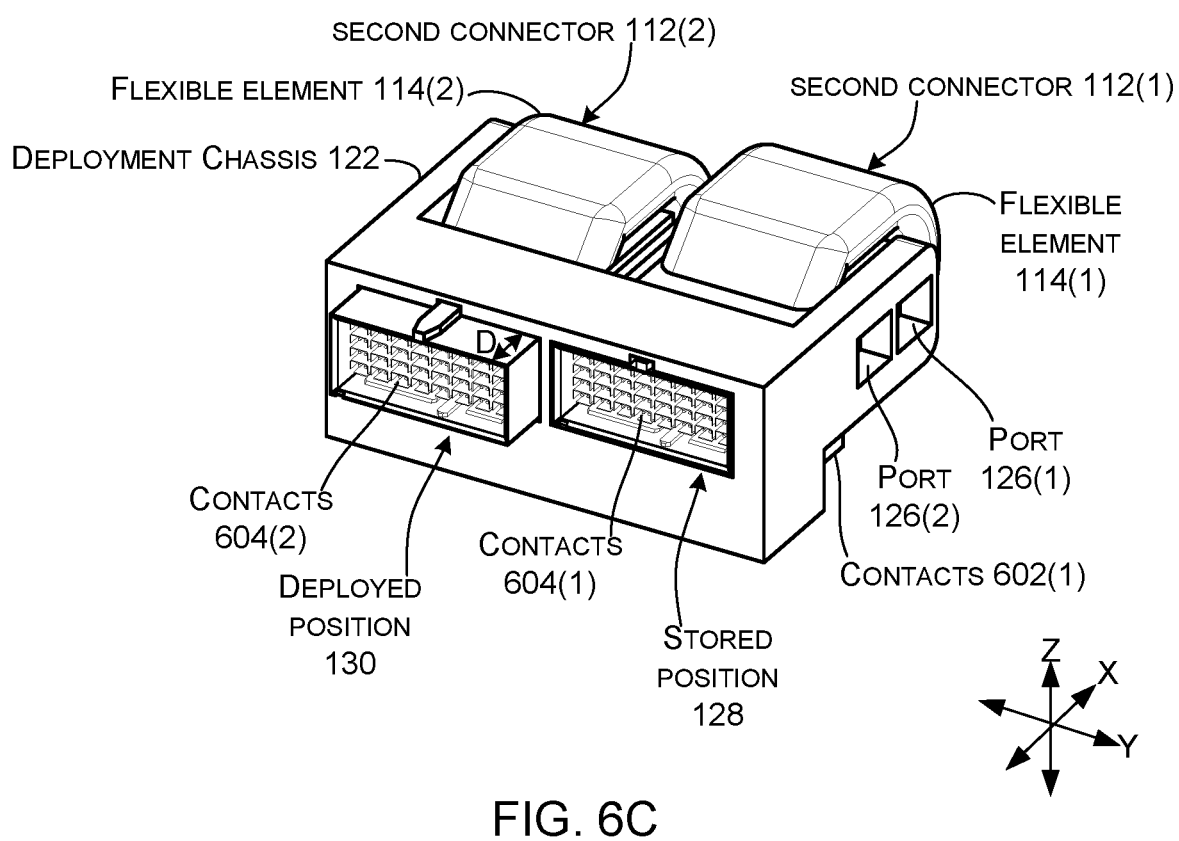
Figure 6D:
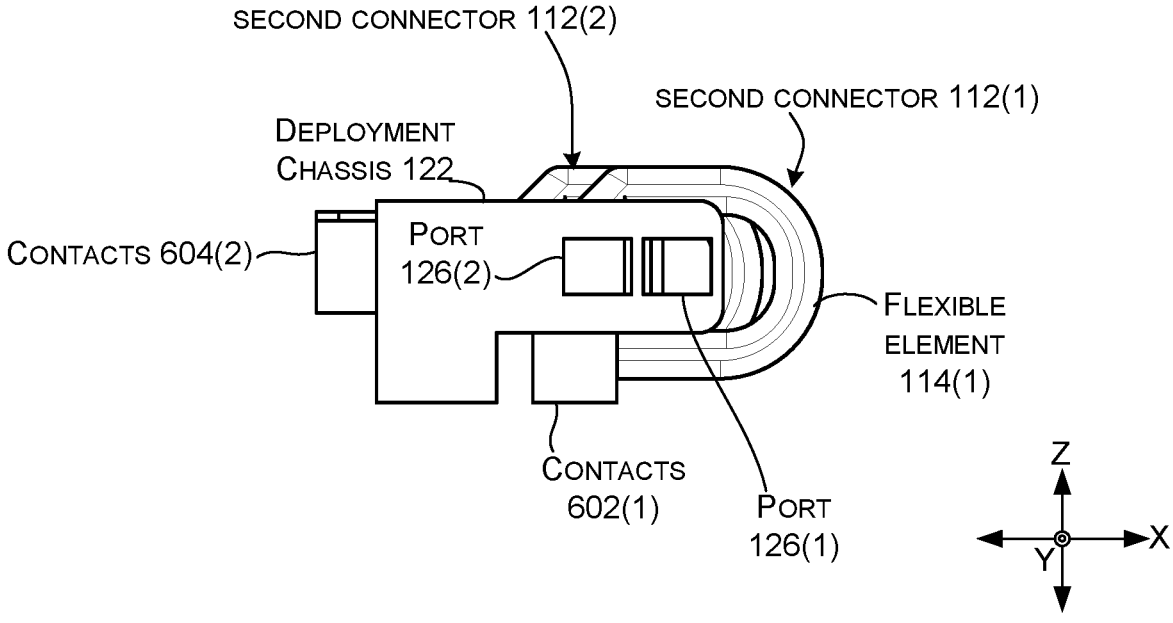

FIGS. 6A-6D collectively show details of example second connectors 112(1) and 112(2). FIGS. 6A and 6B show the second connectors 112 in isolation. FIGS. 6C and 6D show the connectors with their respective deployment chassis 122. For comparison purposes, FIGS. 6A and 6C show second connector 112(1) in the stored position 128 and second connector 112(2) in the deployed position 130.

In this case, contacts 602 for connecting the second connectors 112 to second component 104 (not shown, but shown in FIG. 1A) are facing downward on the drawing page (e.g., in the z reference direction). In this example, contacts 604 for connecting to the first connectors 110 are facing perpendicular to contacts 602. The flexible element 114 arcs from contacts 602 to contacts 604. (Contacts 602 are not readily visible on the drawing page). The flexible element 114 accommodates the position change of the contacts 604 from the stored position 128 of second connector 112(1) to the deployed position 130 of the second connector 112(2), which is represented by displacement arrow "D" on FIG. 6A.

This configuration employs a single hole 116 per second connector 112 that works in cooperation with two ports 126 in the deployment chassis 122. When the actuation spear is positioned in the port 126(2) that is closer to contacts 604 and moved in the y reference direction with the angled surface facing toward contacts 604, contact with the surface of the second connector 112 defining the hole 116 will force the contacts 604 to the left on the drawing page (e.g., toward the first connector 110 in the −x reference direction). In contrast, positioning the actuation spear in port 126(1) with the angled surface facing away from contacts 604 will force contacts 604 to the right (e.g., in the +x reference direction).

Figure 7A:
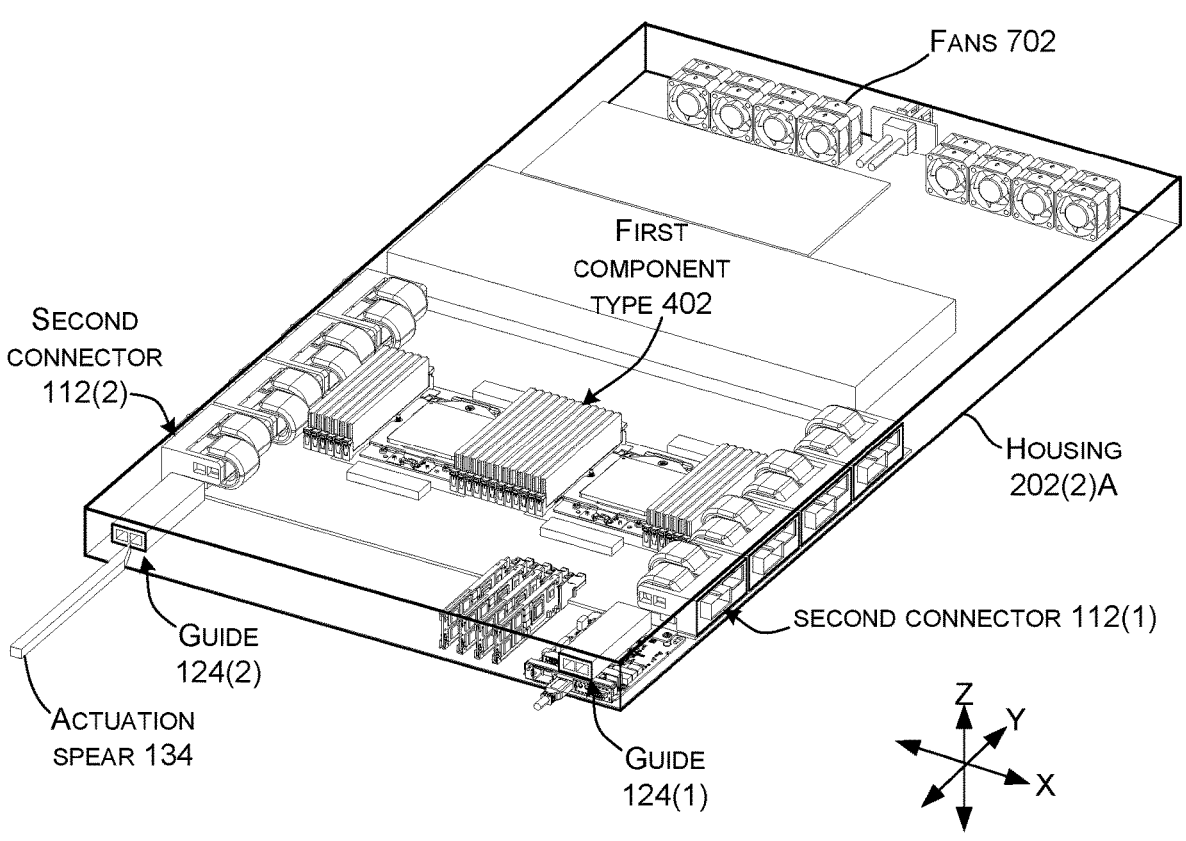
Figure 7B:
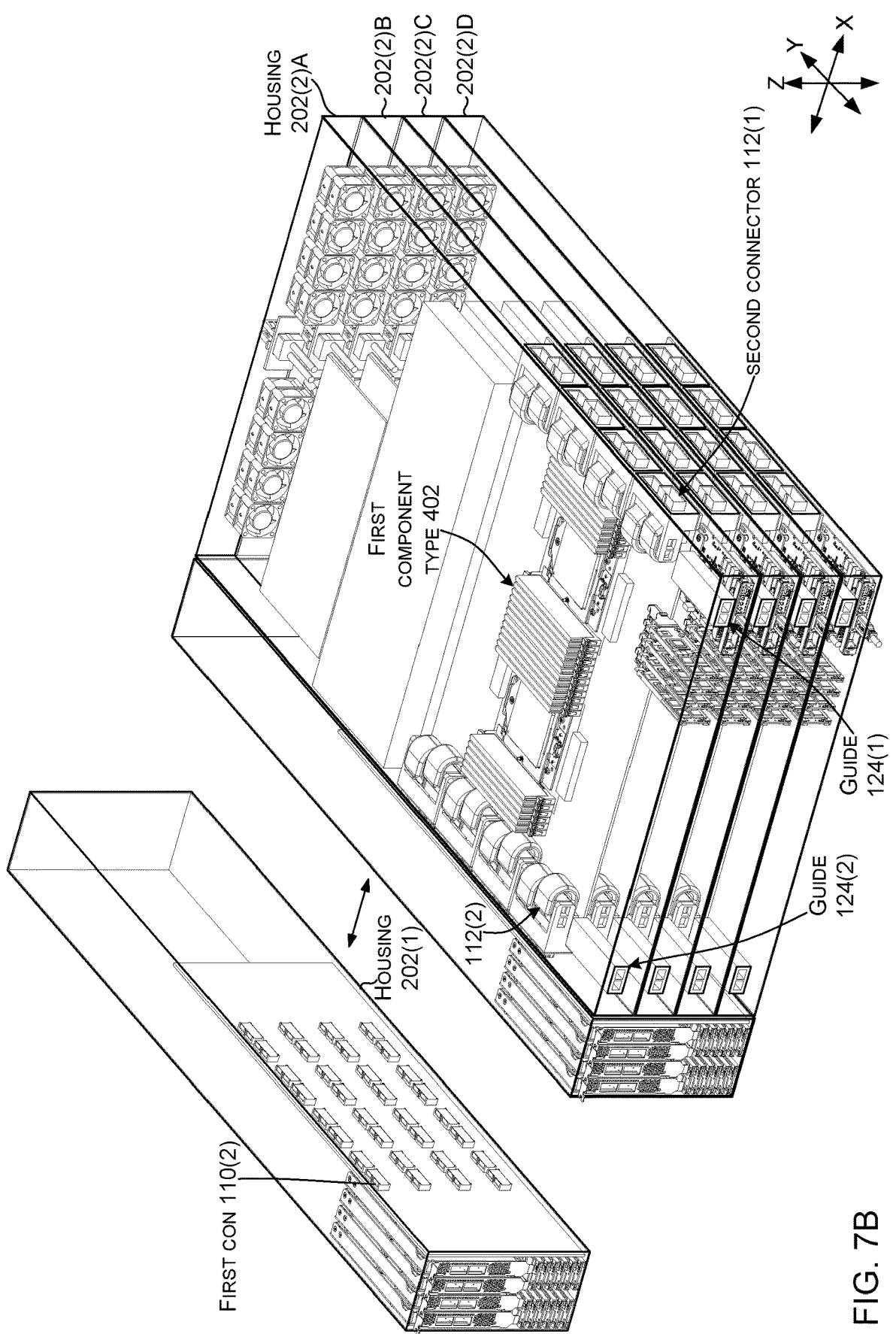

FIGS. 7A and 7B collectively show another example hands-free connector system 100E. FIG. 7A shows a single housing 202(2)A with sets of second connectors 112 positioned on opposing vertical sides. Only two of the second connectors 112 (e.g., one on each vertical side) are labelled to avoid clutter on the drawing page. Each set of connectors 112 is associated with a guide 124 positioned at the front surface. Note that consistent with FIG. 6C, to show relative movement of the connectors 112, they are shown alternating between stored and deployed positions. In reality, each set of connectors 112 would tend to be in one position or the other. Contacts 602 described above in FIGS. 6A-6D connect the second connectors 112 to the components in the housing 202(2). In this example the components in the housing are of first component type 402.

The actuation spear 134 can be employed in the respective guide 124 through the front surface in the y reference direction to change the position of the set of second connectors 112. This aspect has been described above relative to FIGS. 6A-6D and entails moving the contacts 604 in the x reference direction. Note also that the location of the second connectors 112 along the sidewalls does not interfere with air flow from front to back through the housing 202(2)A, which are generally unobstructed and can be promoted by fans 702 positioned along the back surface.

FIG. 7B shows the housing 202(2)A of FIG. 7A installed as part of hands-free connector system 100E. The illustrated implementation includes four horizontally oriented and vertically stacked housings 202(2) that include second connectors 112 on opposing sides. The left side second connectors 112 can be connected to first connectors 110 on vertically oriented housing 202(1). The housing 202(1) is shown both in isolation and installed to aid the reader. Housing 202(1) can contain a second type of component. Similarly, while not shown, another housing that is similar to housing 202(1) can be positioned on the right side of housings 202(2) and connected to connectors 112(1). Connecting and disconnecting the (central) stacked horizontally orientated housings from the (peripheral) vertically oriented housings can be accomplished from the front surface via the guides 124. This implementation is similar to the implementation described above relative to FIGS. 3A-3C and for sake of brevity this description is abbreviated.

Various hands-free connector system configurations have been described that enable system properties such as component density, thermal management, location of connectors, etc. to be obtained that are not feasible with existing connector configurations. The hands-free connector systems can be employed to electrically connect components in adjacent housings. The hands-free connector systems can be employed in other electrical scenarios. Further, the hands-free connector system's first and second connectors could be used in fluid scenarios, such as to deliver cooling fluid in a contained cooling system that is cooling components in multiple adjacent housings.

FIG. 8 shows an example flowchart of an example hands-free connection technique or method 800.

At 802, the method can position a side of a first housing that includes a line of first connectors proximate to a side of a second housing that includes a line of second connectors.

At 804, the method can insert a controller through a front surface of the second housing.

At 806, the method can move the controller parallel to the line of second connectors to sequentially engage the second connectors to electrically connect the line of second connectors to the line of first connectors. In some cases, the controller entails an activation spear. The activation spear can be manipulated by a user. Alternatively, the actuation spear can be manipulated by a computing device, such as by a processor controlling motors. Moving the controller along one axis (e.g., parallel to the line of second connectors) can cause the second connectors to move along a different axis that is not parallel to the axis. For instance, the different axis can be perpendicular to the one axis or oblique to the one axis. The movement along the different axis can cause the second connectors to engage with and form a connection with the first connectors. Subsequently, movement of the controller along the axis can cause the second connectors to move in an opposite direction on the different axis to disconnect from the first connectors.

The described methods can be performed by the systems and/or elements described above and/or below, and/or by other devices and/or systems. The order in which the methods are described is not intended to be construed as a limitation, and any number of the described acts can be combined in any order to implement the method, or an alternate method.

Various examples are described above. Additional examples are described below. One example includes a system comprising a first component comprising a first connector, a second component comprising a second connector that is associated with a deployment chassis that is configured to allow movement of the second connector only along a single axis that is toward and away from the first component, and the deployment chassis configured to convert a force that is perpendicular to the single axis to a force on the second connector that is parallel to the single axis to move the second connector from a stored position toward the first connector to a deployed position to complete a connection and to convert a subsequent force that is perpendicular to the single axis to a force on the second connector that is parallel to the single axis to move the second connector from the deployed position away from the first connector to the stored position to disconnect the connection.

Another example can include any of the above and/or below examples where the first component and the first connector are contained in a first housing and the second component and the second connector are contained in a second housing and wherein moving the second connector from the stored position to the deployed position extends the second connector from the first housing into the second housing.

Another example can include any of the above and/or below examples where the connection is an electrical connection or wherein the connection is a fluid connection.

Another example can include any of the above and/or below examples where the deployment chassis includes first and second ports stacked along the single axis, and wherein receiving the force through the first port moves the second connector from the stored position to the deployed position, and wherein receiving the force through the second port moves the second connector from the deployed position to the stored position.

Another example can include any of the above and/or below examples where the method further comprises an actuation spear that is configured to impart the force perpendicular to the single axis through an individual first or second port.

Another example can include any of the above and/or below examples where the actuation spear defines an angled surface, and wherein the angled surface is directed toward the first connector to move the second connector from the stored position to the deployed position, and wherein the angled surface is directed away from the first connector to move the second connector from the deployed position to the stored position.

Another example can include any of the above and/or below examples where the method further comprises a liquid immersion tank configured to hold the first component, the second component and the deployment chassis in a liquid coolant.

Another example can include any of the above and/or below examples where the second connector is transitioned from the stored position to the deployed position while immersed in the liquid coolant by inserting the actuation spear into the liquid coolant.

Another example includes a system comprising a rectangular housing having connectors positioned along at least one side and a single axis deployment mechanism configured to constrain movement of the connectors to a single axis and upon receiving input from an angle that is perpendicular or oblique to the axis to cause the connectors to move sequentially from either of a stored position or a deployed position to the other of the stored position and the deployed position.

Another example can include any of the above and/or below examples where the connectors are positioned on opposing sides of the rectangular housing.

Another example can include any of the above and/or below examples where the input is received through a guide on a front surface of the rectangular housing or wherein the input rotates a shaft that includes cams that act on the connectors.

Another example can include any of the above and/or below examples where the method further comprises another rectangular housing having different connectors positioned along at least one side that is positioned against the one side of the rectangular housing.

Another example can include any of the above and/or below examples where in the stored position the connectors are contained in the rectangular housing.

Another example can include any of the above and/or below examples where in the deployed position the connectors extend from the rectangular housing into the another rectangular housing and electrically connect to the other connectors.

Another example can include any of the above and/or below examples where the connectors and other connectors are electrically connected without accessing the at least one side of the rectangular housing or the at least one side of the other rectangular housing.

Another example can include any of the above and/or below examples further comprising a third rectangular housing having third connectors positioned along at least one side that is positioned against an opposite side of the rectangular housing.

Another example can include any of the above and/or below examples where the rectangular housing includes a first component type, the another rectangular housing includes a second component type, and the third rectangular housing includes a third component type and wherein the connectors interconnect the first component type the second component type and the third component type in a disaggregated computer architecture.

Another example can include any of the above and/or below examples where the rectangular housing the another rectangular housing and the third rectangular housing are positioned in a liquid coolant and wherein the input is received through a front surface of the rectangular housing that is parallel to a surface of the liquid coolant.

Another example includes a method comprising positioning a side of a first housing that comprises a line of first connectors proximate to a side of a second housing that includes a line of second connectors, inserting a controller through a front surface of the second housing, and moving the controller parallel to the line of second connectors to sequentially engage the second connectors to electrically connect the line of second connectors to the line of first connectors.

Another example can include any of the above and/or below examples where the inserting comprises inserting an actuation spear.

Another example can include any of the above and/or below examples where the inserting the actuation spear is performed by a motor or wherein the inserting is performed by a user.

<div align="center">CONCLUSION</div>

Although subject matter relating to hands-free connector systems has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising:
   a first component comprising a first connector;
   a second component comprising a second connector that is associated with a deployment chassis that is configured to allow movement of the second connector only along a single axis that is toward and away from the first component; and,
   the deployment chassis comprising a lower port positioned proximate to the first connector and an upper port positioned distal to the first connector configured to convert a force, imparted by a controller inserted through the lower port, that is perpendicular to the single axis to a force on the second connector that is parallel to the single axis to move the second connector from a stored position toward the first connector to a deployed position to complete a connection and to convert a subsequent force, imparted by the controller inserted through the upper port, that is perpendicular to the single axis to another force on the second connector that is parallel to the single axis to move the second connector from the deployed position away from the first connector to the stored position to disconnect the connection.

2. The system of claim 1, wherein the first component and the first connector are contained in a first housing and the second component and the second connector are contained in a second housing and wherein moving the second connector from the stored position to the deployed position extends the second connector from the second housing into the first housing.

3. The system of claim 1, wherein the connection is an electrical connection or wherein the connection is a fluid connection.

4. The system of claim 1, wherein the first connector defines stacked holes configured to receive the controller.

5. The system of claim 4, wherein the controller comprises an actuation spear that is configured to impart the force.

6. The system of claim 5, wherein the actuation spear defines an angled surface, and wherein the angled surface is directed toward the first connector to move the second connector from the stored position to the deployed position, and wherein the angled surface is directed away from the first connector to move the second connector from the deployed position to the stored position.

7. The system of claim 6, further comprising a liquid immersion tank configured to hold the first component the second component and the deployment chassis in a liquid coolant.

8. The system of claim 7, wherein the second connector is transitioned from the stored position to the deployed position while immersed in the liquid coolant by inserting the actuation spear into the liquid coolant.

9. A system, comprising:
   a rectangular housing having connectors positioned along at least one side; and,
   a single axis deployment mechanism configured to constrain movement of the connectors to a single axis and comprising a guide that is fixed to the rectangular housing and includes adjacent first and second ports and upon receiving input through the first port to cause the connectors to move sequentially from a stored position to a deployed position and upon receiving subsequent input through the second port to cause the connectors to move sequentially from the deployed position to of the stored position.

10. The system of claim 9, wherein the connectors are positioned on opposing sides of the rectangular housing.

11. The system of claim 9, wherein the input is received through the guide that is positioned relative toon a front surface of the rectangular housing.

12. The system of claim 9, further comprising another rectangular housing having different connectors positioned along at least one side that is positioned against the one side of the rectangular housing.

13. The system of claim 12, wherein in the stored position the connectors are contained in the rectangular housing.

14. The system of claim 13, wherein in the deployed position the connectors extend from the rectangular housing into the another rectangular housing and electrically connect to the different connectors.

15. The system of claim 14, wherein the connectors and the different connectors are electrically connected without accessing the at least one side of the rectangular housing or the at least one side of the another rectangular housing.

16. The system of claim 12, further comprising a third rectangular housing having third connectors positioned along at least one side that is positioned against an opposite side of the rectangular housing.

17. The system of claim 16, wherein the rectangular housing includes a first component type the another rectangular housing includes a second component type and the third rectangular housing includes a third component type and wherein the connectors interconnect the first component type the second component type and the third component type in a disaggregated computer architecture.

18. The system of claim 17, wherein the rectangular housing the another rectangular housing and the third rectangular housing are positioned in a liquid coolant and wherein the input is received through a front surface of the rectangular housing that is parallel to a surface of the liquid coolant.

19. A method, comprising:

positioning a side of a first housing that comprises a line of first connectors proximate to a side of a second housing that includes a line of second connectors;

inserting a controller through a front surface of the second housing and into a port that is fixed relative to the second housing; and, moving the controller through the port parallel to the line of second connectors and into holes defined by the second connectors to sequentially engage the second connectors to electrically connect the line of second connectors to the line of first connectors.

20. The method of claim 19, wherein the inserting comprises inserting an actuation spear.

* * * * *